United States Patent
Seo et al.

(10) Patent No.: US 9,318,607 B2
(45) Date of Patent: Apr. 19, 2016

(54) SEMICONDUCTOR DEVICE AND METHOD OF FABRICATING THE SAME

(71) Applicant: SAMSUNG ELECTRONICS CO., LTD., Gyeonggi-do (KR)

(72) Inventors: Jae-Woo Seo, Seoul (KR); Gun-Ok Jung, Yongin-si (KR); Min-Su Kim, Hwaseong-si (KR); Sang-Shin Han, Suwon-si (KR); Ju-Hyun Kang, Hwaseong-si (KR); Uk-Rae Cho, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/273,789

(22) Filed: May 9, 2014

(65) Prior Publication Data

US 2015/0014775 A1    Jan. 15, 2015

Related U.S. Application Data

(60) Provisional application No. 61/845,555, filed on Jul. 12, 2013.

(30) Foreign Application Priority Data

Oct. 22, 2013    (KR) .................. 10-2013-0126065

(51) Int. Cl.
*H01L 23/528*    (2006.01)
*H01L 27/02*    (2006.01)
(Continued)

(52) U.S. Cl.
CPC .......... *H01L 29/785* (2013.01); *H01L 23/5286* (2013.01); *H01L 23/538* (2013.01);
(Continued)

(58) Field of Classification Search
CPC .............. G06F 17/505; G06F 17/5081; G06F 2217/12; G06F 17/5068; G06F 1/144; H01L 27/0203; H01L 23/5286; H01L 29/785; H01L 27/0924; H01L 23/538; H01L 27/1211; H01L 27/118; H01L 27/0207
See application file for complete search history.

(56) References Cited

U.S. PATENT DOCUMENTS 5,119,169 A    6/1992    Kozono et al.
6,031,982 A    2/2000    Truong et al.
(Continued)

FOREIGN PATENT DOCUMENTS

JP    2006013250 A    1/2006
JP    2007173485 A    7/2007
(Continued)

*Primary Examiner* — Jarrett Stark
*Assistant Examiner* — Bitew Dinke
(74) *Attorney, Agent, or Firm* — Harness, Dickey & Pierce, P.L.C.

(57) ABSTRACT

Provided are a semiconductor device and a method of fabricating the semiconductor device. The semiconductor device includes a first source electrode configured to connect a first power rail to a first impurity region, the first power rail coupled to a first voltage source, a second source electrode configured to connect a second power rail to a second impurity region, the second power rail coupled to a second voltage source, the first and second voltage sources being different, a gate electrode on the first and second impurity regions, a first drain electrode on the first impurity region, a second drain electrode on the second impurity region and an interconnection line connected to the first drain electrode and the second drain electrode, the interconnection line forming at least one closed loop.

20 Claims, 28 Drawing Sheets

(51) Int. Cl.
*H01L 29/78* (2006.01)
*H01L 23/538* (2006.01)
*H01L 27/092* (2006.01)
*H01L 27/12* (2006.01)
H01L 27/06 (2006.01)
H01L 23/00 (2006.01)
H01L 25/10 (2006.01)

(52) U.S. Cl.
CPC ........ *H01L27/0924* (2013.01); *H01L 27/1211* (2013.01); *H01L 24/16* (2013.01); *H01L 24/32* (2013.01); *H01L 24/48* (2013.01); *H01L 25/105* (2013.01); *H01L 27/0207* (2013.01); *H01L 27/0629* (2013.01); *H01L 27/092* (2013.01); *H01L 2224/16225* (2013.01); *H01L 2224/32225* (2013.01); *H01L 2224/48091* (2013.01); *H01L 2224/48227* (2013.01); *H01L 2224/73265* (2013.01); *H01L 2225/1023* (2013.01); *H01L 2225/1058* (2013.01); *H01L 2924/15331* (2013.01)

(56) References Cited

U.S. PATENT DOCUMENTS

| | | | |
|---|---|---|---|
| 6,057,568 A | 5/2000 | Kumagai | |
| 6,252,427 B1 | 6/2001 | Domae et al. | |
| 6,879,020 B2 | 4/2005 | Yamaguchi | |
| 6,925,627 B1 | 8/2005 | Longway et al. | |
| 7,005,888 B1 | 2/2006 | Baxter | |
| 7,227,200 B2 | 6/2007 | Jin | |
| 7,786,589 B2 | 8/2010 | Matsunaga et al. | |
| 7,941,776 B2 | 5/2011 | Majumder et al. | |
| 8,063,415 B2 | 11/2011 | Tsuda | |
| 8,357,955 B2 | 1/2013 | Tanaka | |
| 2004/0232444 A1* | 11/2004 | Shimizu | 257/202 |
| 2005/0138598 A1* | 6/2005 | Kokubun | 716/20 |
| 2006/0138565 A1* | 6/2006 | Su et al. | 257/401 |
| 2006/0170052 A1* | 8/2006 | Kanamoto | H01L 21/761 257/351 |
| 2008/0111158 A1* | 5/2008 | Sherlekar et al. | 257/207 |
| 2009/0026546 A1 | 1/2009 | Shimada et al. | |
| 2010/0127333 A1* | 5/2010 | Hou et al. | 257/368 |
| 2010/0187609 A1* | 7/2010 | Moroz et al. | 257/368 |
| 2011/0049575 A1* | 3/2011 | Tanaka | H01L 27/0207 257/206 |
| 2012/0131533 A1* | 5/2012 | Marinet | 716/122 |
| 2013/0026571 A1* | 1/2013 | Kawa et al. | 257/347 |
| 2013/0026572 A1* | 1/2013 | Kawa et al. | 257/347 |
| 2013/0181297 A1* | 7/2013 | Liaw | 257/390 |
| 2013/0263077 A1* | 10/2013 | Baek et al. | 716/122 |
| 2013/0334610 A1* | 12/2013 | Moroz et al. | 257/369 |
| 2014/0097493 A1* | 4/2014 | Baek et al. | 257/347 |
| 2014/0217513 A1* | 8/2014 | Hayashi | H01L 27/11807 257/369 |

FOREIGN PATENT DOCUMENTS

| | | |
|---|---|---|
| JP | 2009016683 A | 1/2009 |
| JP | 2009272340 A | 11/2009 |
| JP | 2011258712 A | 12/2011 |
| JP | 2011258712 A * | 12/2011 |
| KR | 20010017241 A | 3/2001 |
| KR | 20070034657 A | 3/2007 |
| KR | 20070069708 A | 7/2007 |

* cited by examiner

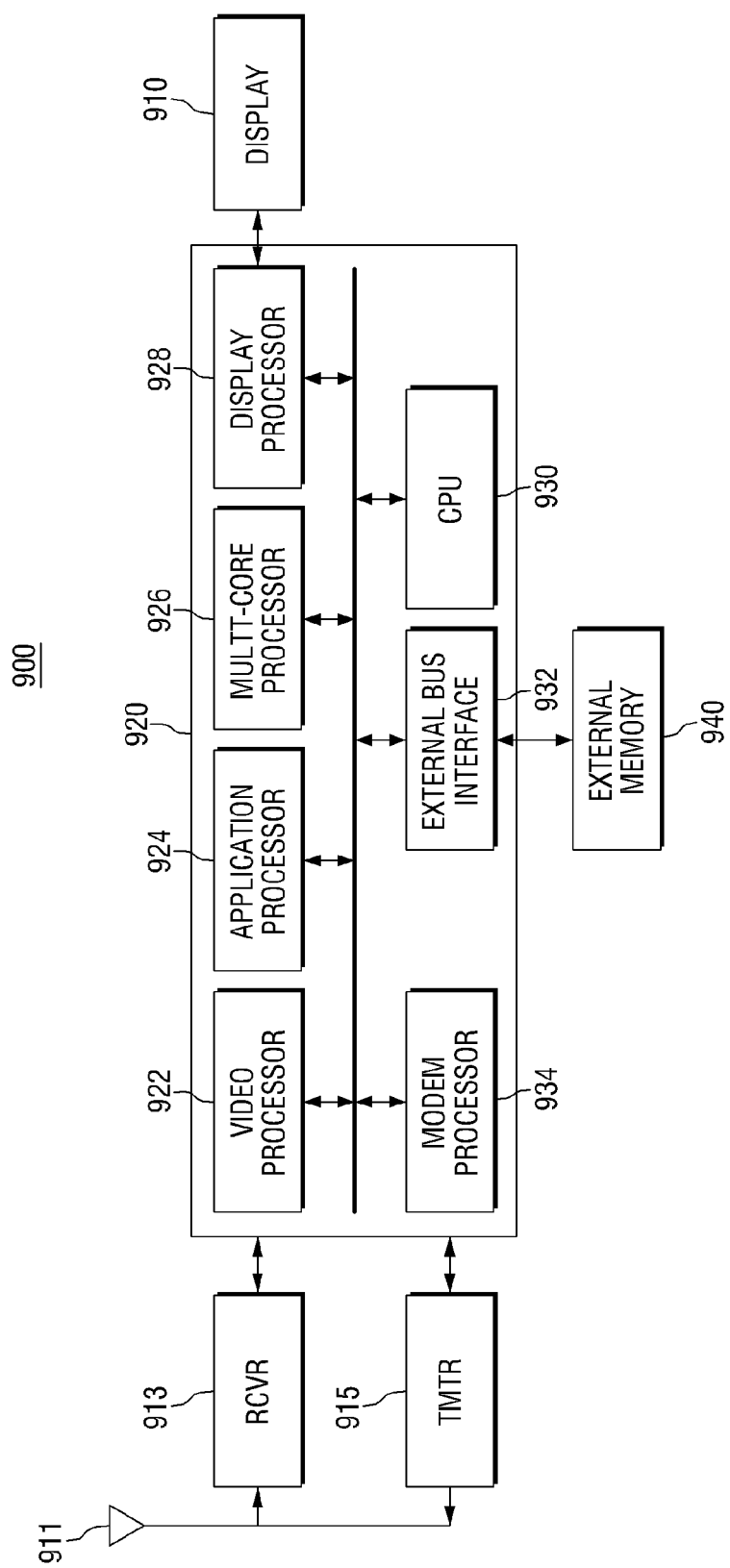

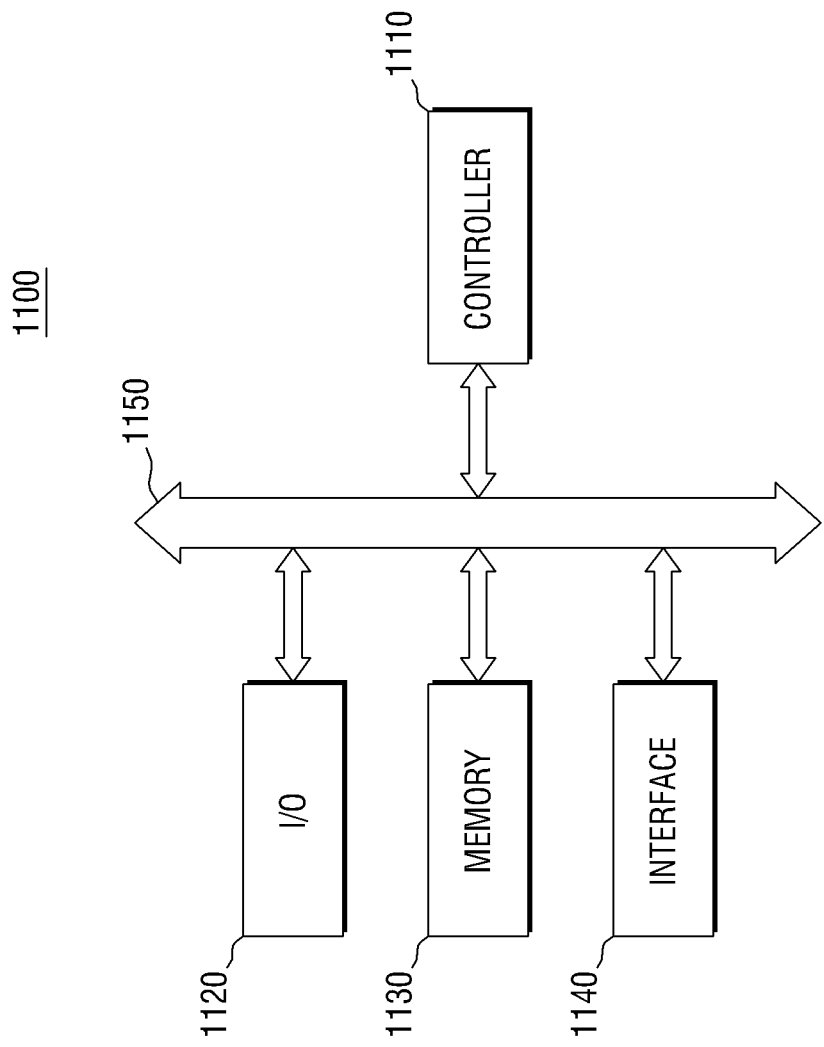

1200

1400

SEMICONDUCTOR DEVICE AND METHOD OF FABRICATING THE SAME

This application claims priority to U.S. Provisional Application No. 61/845,555 filed on Jul. 12, 2013 in the USPTO and from Korean Patent Application No. 10-2013-0126065 filed on Oct. 22, 2013 in the Korean Intellectual Property Office, the disclosure of each which is incorporated herein by reference in its entirety.

BACKGROUND

1. Field

Example embodiments relate to a semiconductor device and/or a method of fabricating the same.

2. Description of the Related Art

Electromigration (EM) is a phenomenon in which atoms of an electrode are moved by carriers in, for example, a line. The movement of the atoms of the electrode can create voids in the line, thereby aggravating the electrical conductivity of the line.

Therefore, research is being actively conducted to reduce electromigration.

SUMMARY

Aspects of example embodiments provide a semiconductor device having reduced electromigration.

Aspects of example embodiments also provide a method of fabricating a semiconductor device having reduced electromigration.

However, aspects of example embodiments are not restricted to the one set forth herein. The above and other aspects of example embodiments will become more apparent to one of ordinary skill in the art to which example embodiments pertains by referencing the detailed description of example embodiments given below.

According to at least one example embodiment, there is provided a semiconductor device including a first source electrode configured to connect a first power rail to a first impurity region, the first power rail coupled to a first voltage source, a second source electrode configured to connect a second power rail to a second impurity region, the second power rail coupled to a second voltage source, the first and second voltage sources being different, a gate electrode on the first and second impurity regions, a first drain electrode on the first impurity region, a second drain electrode on the second impurity region and an interconnection line connected to the first drain electrode and the second drain electrode, the interconnection line forming at least one closed loop.

According to another example embodiment, there is provided a semiconductor device including a first transistor, a second transistor different from the first transistor and an interconnection line connected to respective output terminals of the first and second transistors and a circuit element, the interconnection line forming at least one closed loop.

According to another example embodiment, there is provided a semiconductor device including an inverter configured to invert a voltage level of an input signal and output the input signal having the inverted voltage level, a circuit element configured to receive an output of the inverter and an interconnection line configured to provide the output of the inverter to the circuit element, the interconnection line forming at least one closed loop.

According to another example embodiment, there is provided a method of fabricating a semiconductor device, the method including fabricating a semiconductor device using a standard cell, wherein the standard cell includes, a PMOS transistor, an NMOS transistor, and an interconnection line connected to respective output terminals of the PMOS transistor and the NMOS transistor and a circuit element, the interconnection line forming at least one closed loop.

At least one example embodiment discloses a semiconductor device including an input line, a circuit element and an interconnection line having at least a closed loop portion, the interconnection line coupled to a plurality of transistors, the interconnection line and the plurality of transistors configured to selectively connect the input line to the circuit element.

At least another example embodiment discloses a semiconductor device including an input line, a circuit element and an interconnection line coupled to a plurality of transistors, the plurality of transistors configured to apply a first current in a first direction along the interconnection line and a second current in a second direction along the interconnection line, the interconnection line and the plurality of transistors configured to selectively connect the input line to the circuit element.

BRIEF DESCRIPTION OF THE DRAWINGS

The above and other aspects and features of example embodiments will become more apparent by describing in detail example embodiments thereof with reference to the attached drawings, in which:

FIG. 20 is a block diagram of a wireless communication device including semiconductor devices according to example embodiments;

FIG. 22 is a block diagram illustrating an electronic system including semiconductor devices according to example embodiments;

DETAILED DESCRIPTION

Figure 1:
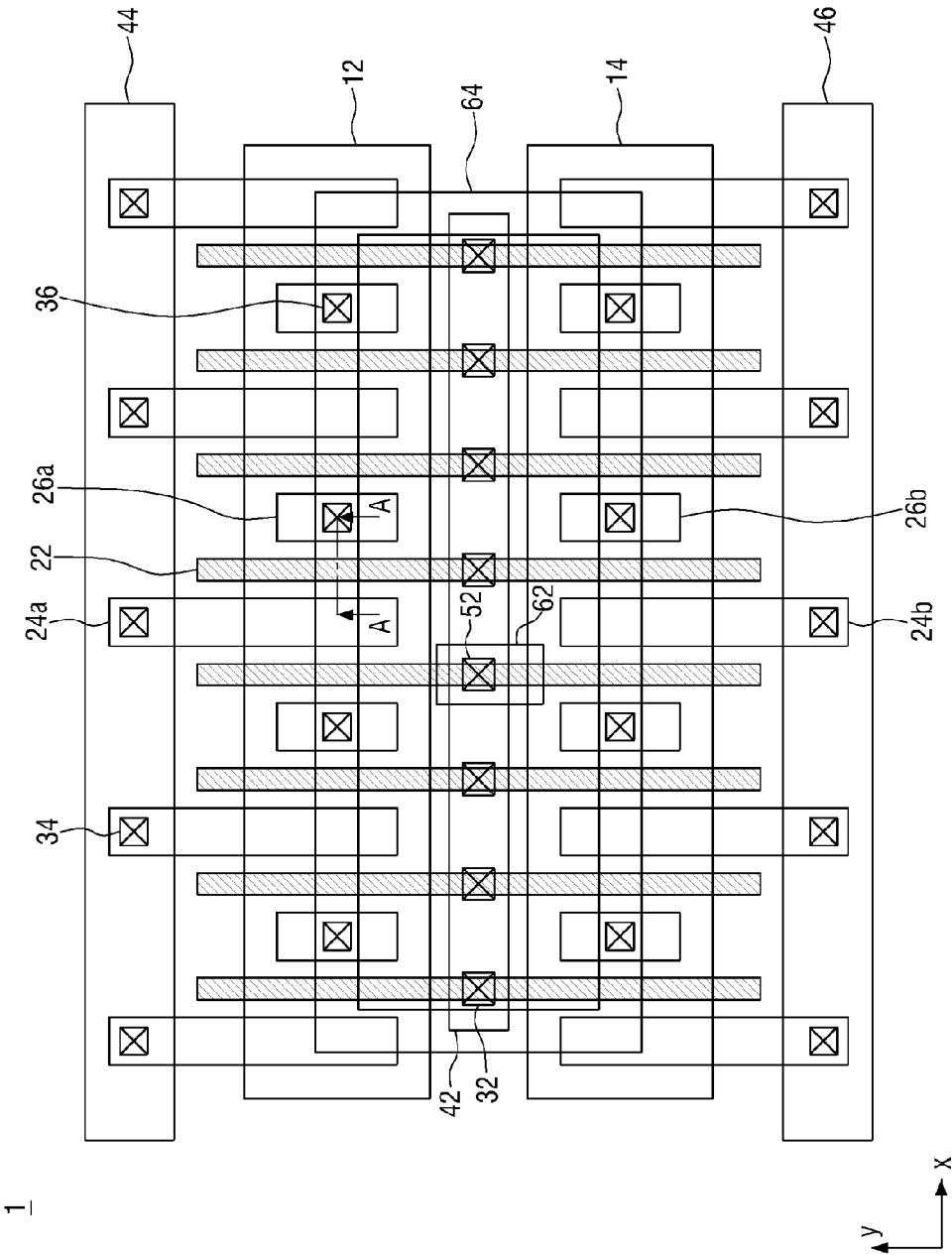
FIG. 1 is a layout diagram of a semiconductor device according to example embodiment.

Advantages and features of example embodiments and methods of accomplishing the same may be understood more readily by reference to the following detailed description of preferred embodiments and the accompanying drawings. Example embodiments may, however, be embodied in many different forms and should not be construed as being limited to the embodiments set forth herein. Rather, these embodiments are provided so that this disclosure will be thorough and complete and will fully convey the concept of example embodiments to those skilled in the art, and example embodiments will only be defined by the appended claims. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing example embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of example embodiments.

Example embodiments will be described with reference to perspective views, cross-sectional views, and/or plan views, in which example embodiments are shown. Thus, the profile of an exemplary view may be modified according to manufacturing techniques and/or allowances. That is, the example embodiments are not intended to limit the scope of example embodiments but cover all changes and modifications that can be caused due to a change in manufacturing process. Thus, regions shown in the drawings are illustrated in schematic form and the shapes of the regions are presented simply by way of illustration and not as a limitation.

Unless defined otherwise, all technical and scientific terms used herein have the same meaning as commonly understood by one of ordinary skill in the art to which example embodiments belong. It is noted that the use of any and all examples, or exemplary terms provided herein is intended merely to better illuminate example embodiments and is not a limitation on the scope of example embodiments unless otherwise specified. Further, unless defined otherwise, all terms defined in generally used dictionaries may not be overly interpreted.

A semiconductor device according to an example embodiment will now be described with reference to FIGS. 1 through 5.

Figure 2:
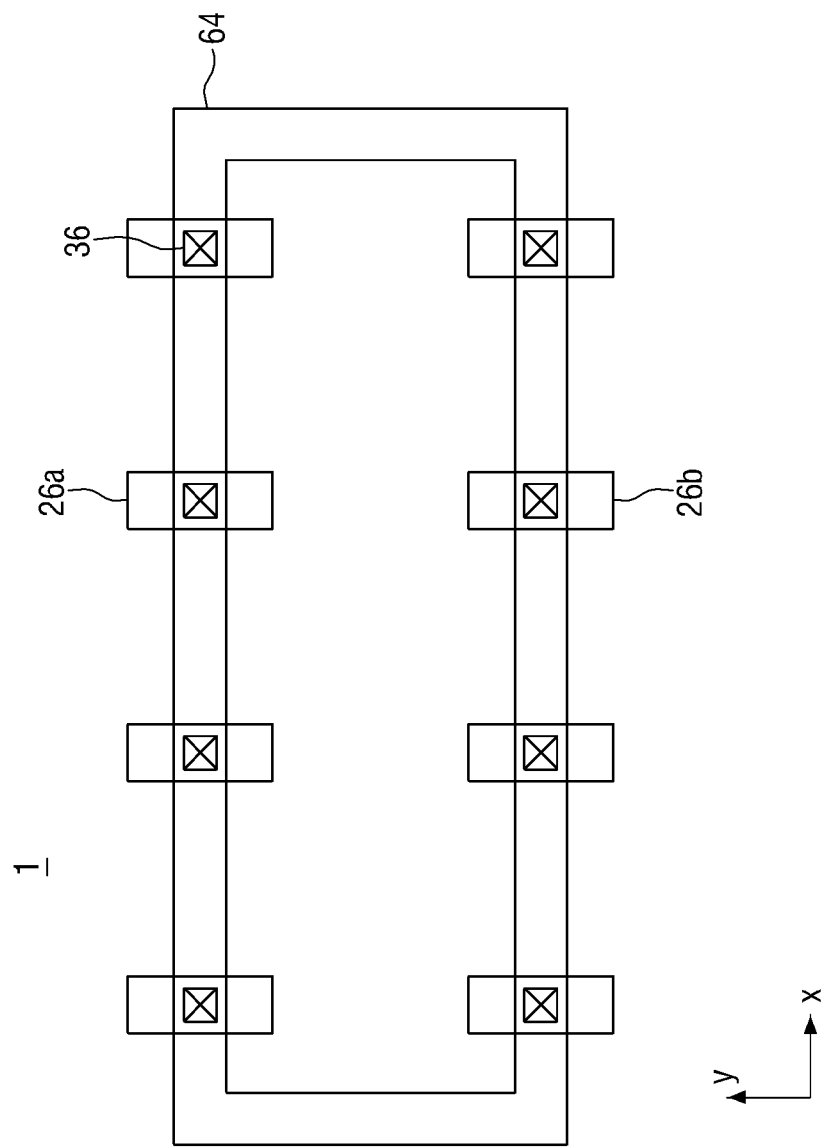
FIG. 2 is a partial layout diagram illustrating first and second drain electrodes and an interconnection line of FIG. 1.
Figure 3:
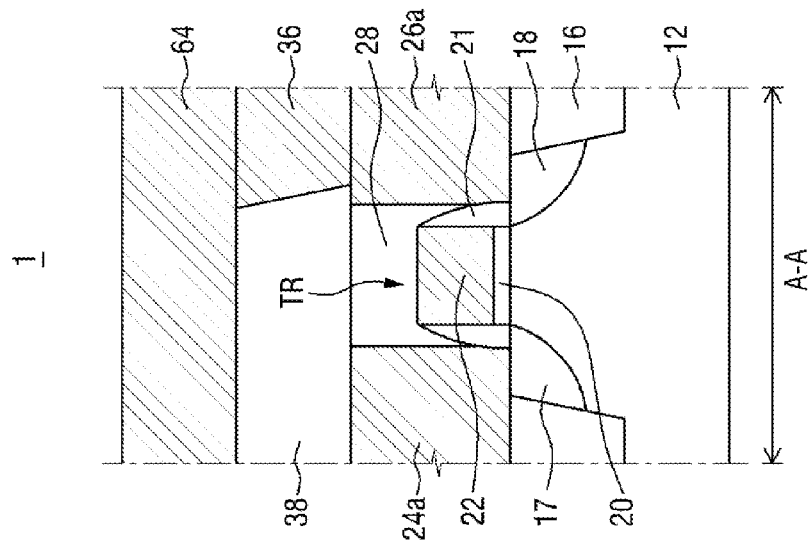
FIG. 3 is a cross-sectional view taken along the line A-A of FIG. 1.
Figure 4:
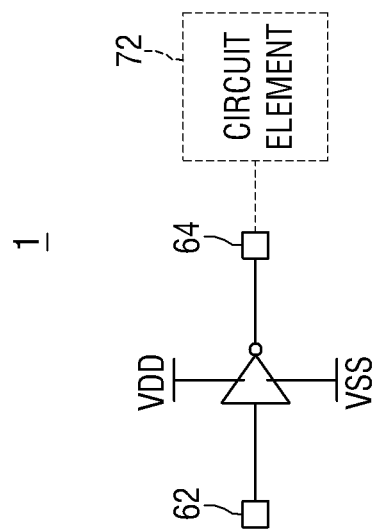
FIG. 4 is a circuit diagram of the semiconductor device according to the example embodiment of FIG. 1.
Figure 5:
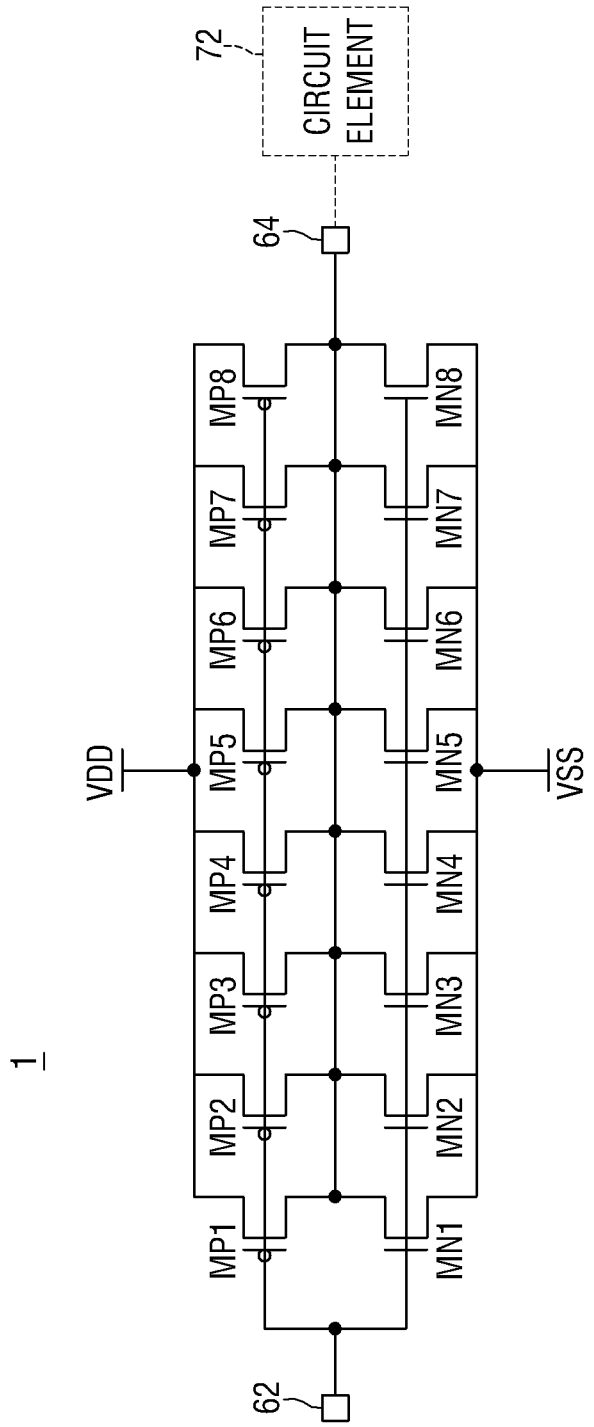
FIG. 5 is a detailed version of the circuit diagram of FIG. 4.

FIG. 1 is a layout diagram of a semiconductor device 1 according to an example embodiment. FIG. 2 is a partial layout diagram illustrating first and second drain electrodes 26a and 26b and an interconnection line 64 of FIG. 1. FIG. 3 is a cross-sectional view taken along the line A-A of FIG. 1. FIG. 4 is a circuit diagram of the semiconductor device 1 according to the example embodiment FIG. 1. FIG. 5 is a detailed version of the circuit diagram of FIG. 4.

An inverter will hereinafter be described as an example of the semiconductor device 1 according to the current example embodiment. However, the semiconductor device 1 is not limited to the inverter.

Referring to FIGS. 1 through 5, the semiconductor device 1 includes first and second impurity regions 12 and 14, gate electrodes 22, first and second source electrodes 24a and 24b, the first and second drain electrodes 26a and 26b, and the interconnection line 64.

The first impurity region 12 and the second impurity region 14 may extend in an X direction. The first impurity region 12 and the second impurity region 14 may be formed in or on a substrate. Here, the substrate in/on which the first impurity region 12 and the second impurity region 14 are formed may be a semiconductor substrate. The semiconductor substrate may be formed of one or more semiconductor materials selected from the group consisting of Si, Ge, SiGe, GaP, GaAs, SiC, SiGeC, InAs and InP.

In example embodiments, each of the first impurity region 12 and the second impurity region 14 may be an epitaxial layer formed of a semiconductor material. The epitaxial layer may be formed on, e.g., an insulating substrate. In other words, each of the first impurity region 12 and the second impurity region 14 may be formed as a silicon-on-insulator (SOI).

The first impurity region 12 and the second impurity region 14 formed as SOIs can reduce a delay time in the operation process of the semiconductor device 1.

In the current example embodiment, the first impurity region 12 and the second impurity region 14 may have different conductivity types. In an example embodiment, the first impurity region 12 may include an N-type impurity region, and the second impurity region 14 may include a P-type impurity region.

The gate electrodes 22 may be disposed on the first and second impurity regions 12 and 14 and extend in a Y direction. As shown in FIG. 1, the gate electrodes 22 may traverse the first and second impurity regions 12 and 14.

The gate electrodes 22 may include a conductive material. In an example embodiment, the gate electrodes 22 may include polysilicon. In some other embodiments, the gate electrodes 22 may include a metal.

A gate insulating layer 20 may be formed between the gate electrodes 22 and the first and second impurity regions 12 and 14. The gate insulating layer 20 may be formed of an oxide layer. In some example embodiments, the gate insulating layer 20 may be formed of, but not limited to, $SiO_2$, $HfO_2$, $Al_2O_3$, $ZrO_2$, or $TaO_2$.

The gate electrodes 22 may be separated from each other by a device isolation layer 16. The device isolation layer 16 may be formed in the first and second impurity regions 12 and 14. In an example embodiment, the device isolation layer 16 may include a shallow trench isolation (STI) layer. However, the device isolation layer 16 is not limited to the STI layer. In an example embodiment, the device isolation layer 16 may also include a deep trench isolation (DTI) layer.

A source region 17 may be formed in each of the first and second impurity regions 12 and 14 disposed on a side of each gate electrode 22. A drain region 18 may be formed in each of the first and second impurity regions 12 and 14 disposed on the other side of each gate electrode 22.

In an example embodiment, the source region 17 and the drain region 18 formed in the first impurity region 12 may include P-type impurities, and the source region 17 and the drain region 18 formed in the second impurity region 14 may include N-type impurities. However, example embodiments are not limited thereto, and the conductivity type can vary.

Spacers 21 may be formed on both sides of each gate electrode 22, respectively. In some example embodiments, each of the spacers 21 may include, e.g., a nitride layer. Specifically, each of the spacers 21 may include, but not limited to, a silicon nitride (SiN) layer.

In FIG. 3, the spacers 21 are pillar-shaped. However, the shape of the spacers 21 is not limited to the pillar shape. The shape of the spacers 21 can be modified to any shape such as an L shape.

The source region 17, the drain region 18, the gate insulating layer 20 and a gate electrode 22 formed in each of the first and second impurity regions 12 and 14 may form one transistor TR. Therefore, if the source region 17 and the drain region 18 formed in the first impurity region 12 include P-type impurities and if the source region 17 and the drain region 18 formed in the second impurity region 14 include N-type impurities as described above, a p-type metal oxide semiconductor (PMOS) transistor may be formed on the first impurity region 12, and an n-type metal oxide semiconductor (NMOS) transistor may be formed on the second impurity region 14.

In FIGS. 1, 4 and 5, eight PMOS transistors MP1 through MP8 are formed on the first impurity region 12, and eight NMOS transistors MN1 through MN8 are formed on the second impurity region 14. However, example embodiments are not limited thereto. The number of transistors formed can vary according to the performance of the inverter.

The first source electrode 24a may be formed on a side of each gate electrode 22 to contact the source region 17 formed in the first impurity region 12. The first source electrode 24a may be connected to a first power rail 44, to which a first voltage VDD is applied, by a power rail contact 34. Accordingly, the first source electrode 24a may electrically connect the first power rail 44, to which the first voltage VDD is applied, to the source region 17 formed in the first impurity region 12.

The second source electrode 24b may be formed on the side of each gate electrode 22 to contact the source region 17 formed in the second impurity region 14. The second source electrode 24b may be connected to a second power rail 46, to which a second voltage VSS is applied, by another power rail contact 34. Accordingly, the second source electrode 24b may electrically connect the second power rail 46, to which the second voltage VSS is applied, to the source region 17 formed in the second impurity region 14.

In an example embodiment, the first voltage VDD applied to the first power rail 44 may include a power supply voltage, and the second voltage VSS applied to the second power rail 46 may include a ground voltage. However, example embodiments are not limited thereto, and the first voltage VDD and the second voltage VSS can vary. For example, in some other example embodiments, the first voltage VDD applied to the first power rail 44 may include a first power supply voltage, and the second voltage VSS applied to the second power rail 46 may include a second power supply voltage smaller than the first power supply voltage.

The first drain electrode 26a may be formed on the other side of each gate electrode 22 to contact the drain region 18 formed in the first impurity region 12. The first drain electrode 26a may be connected to the interconnection line 64 by a drain contact 36.

The second drain electrode 26b may be formed on the other side of each gate electrode 22 to contact the drain region 18 formed in the second impurity region 14. The second drain electrode 26b may be connected to the interconnection line 64 by another drain contact 36.

As shown in FIG. 3, the first and second source electrodes 24a and 24b may be insulated from the first and second drain electrodes 26a and 26b by a first interlayer insulating film 28. The drain contacts 36 may be insulated from the first and second power rails 44 and 46, gate contacts 32, a distribution line 42, and an input contact 52 by a second interlayer insulating film 38.

The gate electrodes 22 may be electrically connected to the distribution line 42 by the gate contacts 32. The distribution line 42 extending in the X direction may be electrically connected to an input line 62 by the input contact 52.

In an example embodiment, the input line 62, the input contact 52, the distribution line 42, the gate contacts 32, the interconnection line 64, and the drain contacts 36 may include a conductive material. The conductive material may be, but is not limited to, a metal.

In an example embodiment, the input line 62 and the interconnection line 64 may be formed at the same height. In addition, the distribution line 42 and the first and second power rails 44 and 46 may be formed at the same height. Here, the input line 62 and the interconnection line 64 may be formed higher than the distribution line 42 and the first and second power rails 44 and 46 by a height of the input contact 52.

The gate electrodes 22, the first and second source electrodes 24a and 24b, and the first and second drain electrodes 26a and 26b may be formed at the same height. Here, the distribution line 42 and the first and second power rails 44 and 46 may be formed higher than the gate electrodes 22, the first and second source electrodes 24a and 24b, and the first and second drain electrodes 26a and 26b by a height of the gate contacts 32 or a height of the power rail contacts 34.

The input line 62 and the interconnection line 64 may be formed higher than the gate electrodes 22, the first and second source electrodes 24a and 24b, and the first and second drain electrodes 26a and 26b by a height of the drain contacts 36. Therefore, the height of the drain contacts 36 may be greater than the height of the gate contacts 32 or the height of the power rail contacts 34.

A circuit element 72 may be electrically connected to the interconnection line 64. Although not specifically shown in the drawings, the circuit element 72 may be connected to the interconnection line 64 by a contact (not shown) formed as, e.g., a via, and a portion of the interconnection line 64 may extend in the X direction further than illustrated and may be connected to the circuit element 72. That is, in the current example embodiment, the circuit element 72 can be connected to the interconnection line 64 in any way.

The circuit element 72 may include a passive circuit element and an active circuit element. Examples of the passive circuit element may include, but not limited to, a resistor, a capacitor, and an inductor. Examples of the active circuit element may include, but not limited to, a diode transistor.

Referring to FIG. 4, the semiconductor device 1 can be expressed as an inverter that is driven by the first voltage VDD and the second voltage VSS. Therefore, an input signal provided to the input line 62 may have its voltage level inverted by the input line 62 and then output accordingly to the interconnection line 64. The output signal may be provided to the circuit element 72 via the interconnection line 64 that forms a closed loop.

Specifically, referring to FIG. 5, the voltage level of the input signal provided to the input line 62 is inverted by the inverter which includes the eights PMOS transistors MP1 through MP8 and the eight NMOS transistors MN1 through MN8. The input signal having its voltage level inverted is output as an output signal. Then, the output signal is provided to the element circuit 72 via the interconnection line 64 that forms a closed loop.

In the semiconductor device 1, since the interconnection line 64 forms a closed loop, electromigration in the semiconductor device 1 can be reduced. This will be described in greater detail with reference to FIGS. 6 and 7.

Figure 6:
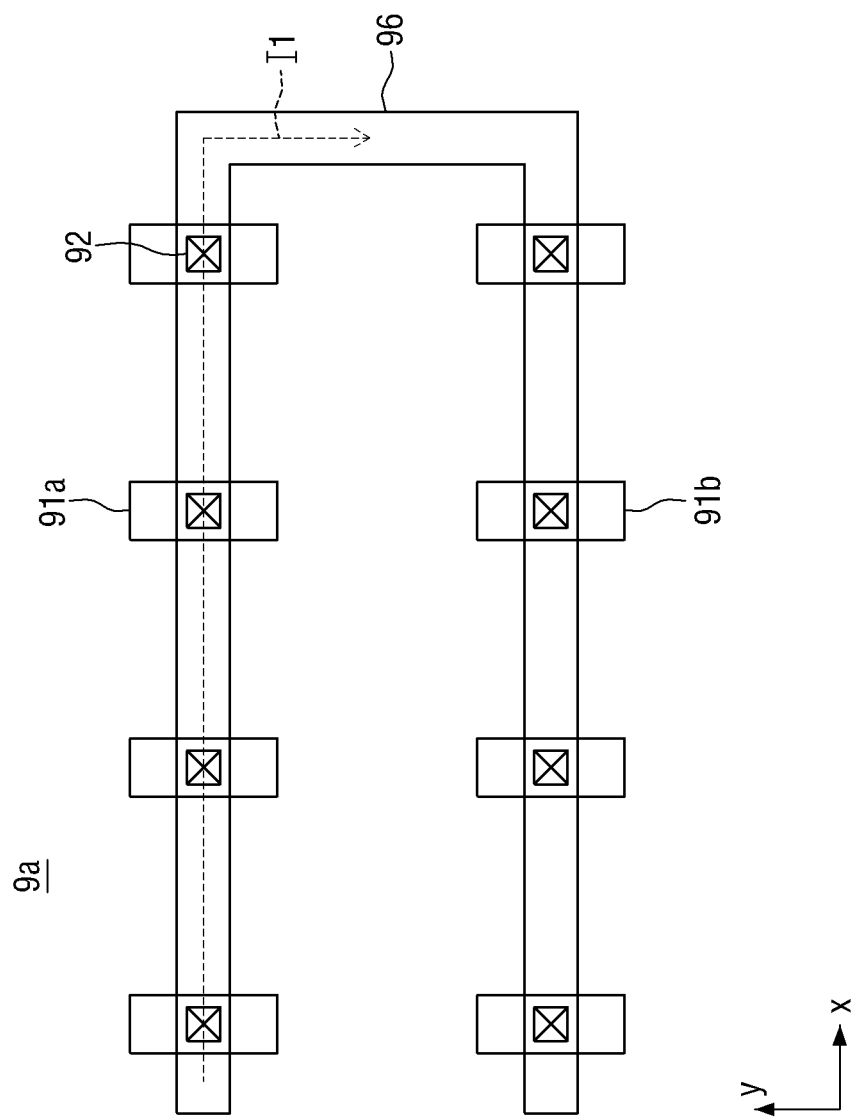
FIGS. 6 and 7 are diagrams illustrating the effect of the semiconductor device according to the example embodiment of FIG. 1.
Figure 7:
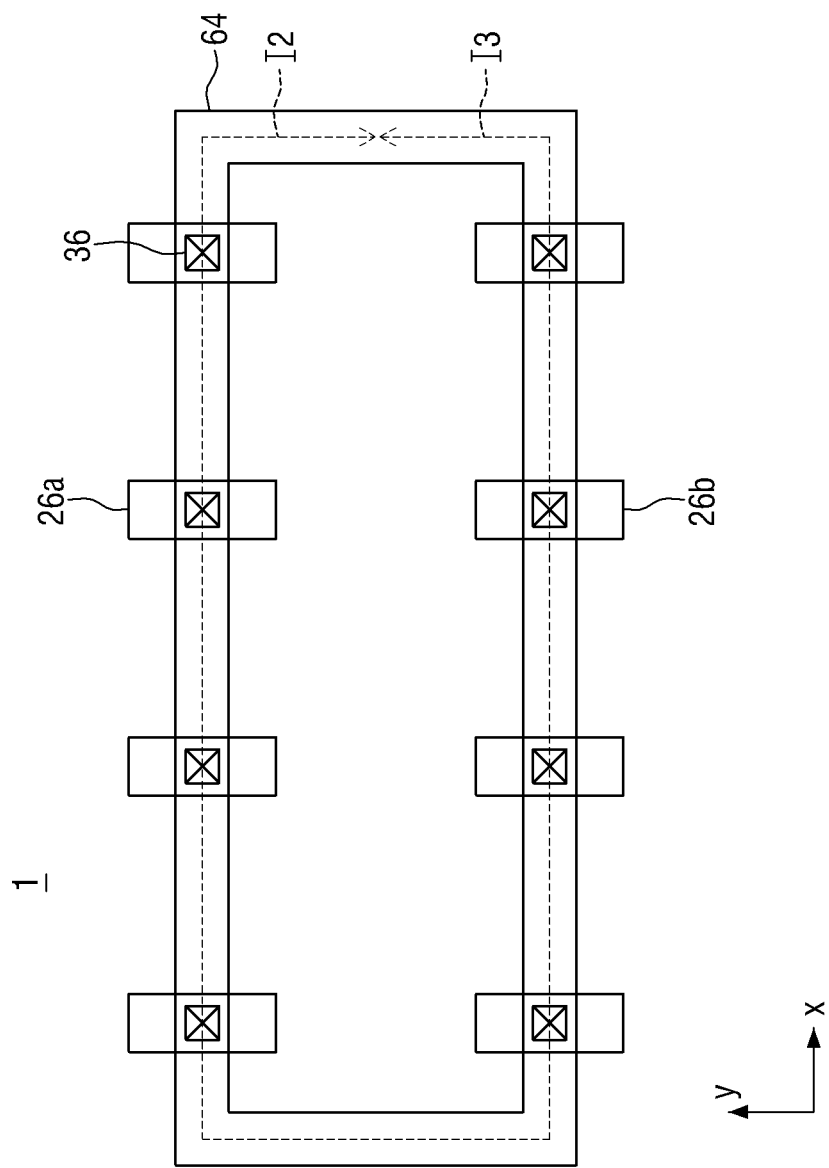

FIGS. 6 and 7 are diagrams illustrating the effect of the semiconductor device 1 according to the example embodiment of FIG. 1.

FIG. 6 is a diagram illustrating a current flow in a semiconductor device 9a in which an interconnection line 96 does not form a closed loop, unlike the interconnection line 64 in the semiconductor device 1. Referring to FIG. 6, an electric current I1 supplied from first and second drain electrodes 91a and 91b through drain contacts 92 flows only in one direction within the interconnection line 96. Accordingly, atoms of the interconnection line 96 continuously receive a force in one direction (indicated by a dotted line) while the semiconductor device 9a operates. When the atoms of the interconnection line 96 continuously receive a force in one direction (indicated by the dotted line), the probability that voids will be created in the interconnection line 96 by electromigration increases.

However, if the interconnection line 64 forms a closed loop as in the semiconductor device 1 illustrated in FIG. 7, an electric current flows in a distributed manner within the semiconductor device 1. Specifically, referring to FIG. 7, in the semiconductor device 1, electric currents I2 and I3 supplied from the first and second drain electrodes 26a and 26b through the drain contacts 36 flow in both directions within the interconnection line 64. Accordingly, the force that atoms of the interconnection line 64 receive is reduced, compared with in the semiconductor device 9a described above. In some cases, some of the atoms of the interconnection line 64 receive forces in both directions (indicated by a dotted line) while the semiconductor device 1 operates. Therefore, the probability that voids will be created in the interconnection line 64 by electromigration is significantly reduced, compared with when the interconnection line 96 does not form a closed loop as described above.

A semiconductor device according to another example embodiment will now be described with reference to FIGS. 8 and 9.

Figure 8:
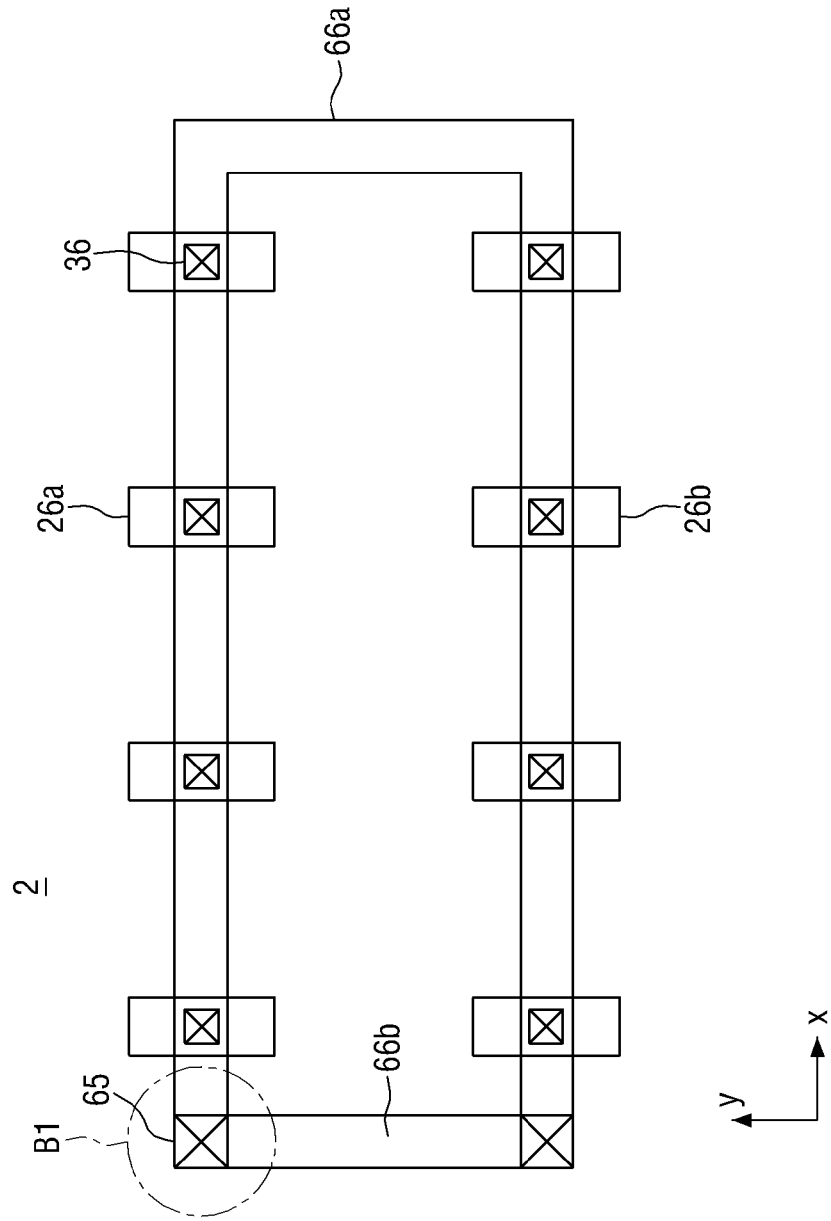
FIG. 8 is a partial layout diagram of a semiconductor device according to an example embodiment.

FIG. 8 is a partial layout diagram of a semiconductor device 2. FIG. 9 is a partial perspective view of a region B1 of FIG. 8. For simplicity, a redundant description of elements already described in the will be omitted, and the current embodiment will hereinafter be described, focusing mainly on differences with FIGS. 1-5.

Figure 9:
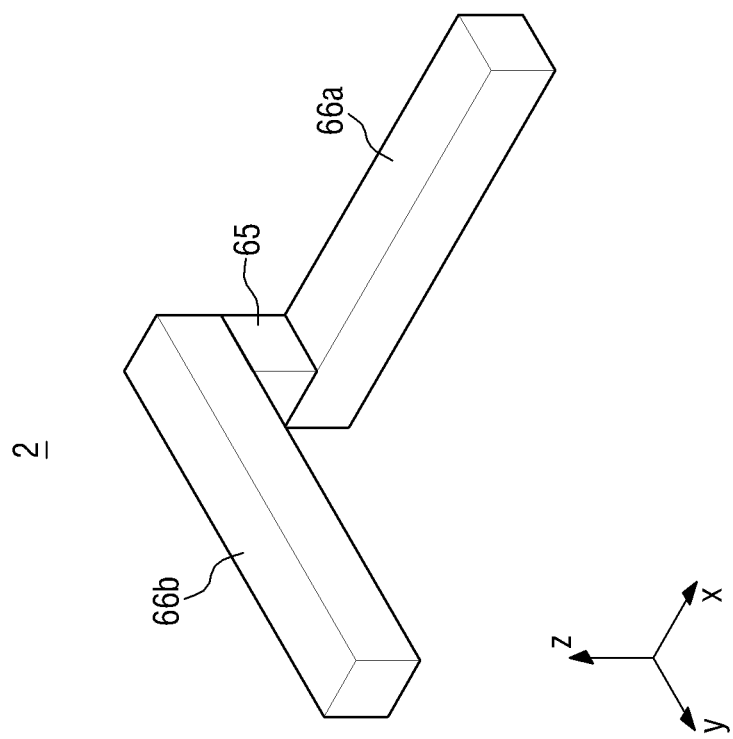
FIG. 9 is a partial perspective view of a region B1 of FIG. 8.

Referring to FIGS. 8 and 9, an interconnection line (66a, 66b) of the semiconductor device 2 may include a first interconnection line 66a and a second interconnection line 66b.

The first interconnection line 66a may be connected to first and second drain electrodes 26a and 26b by drain contacts 36. The first interconnection line 66a may be U-shaped. Specifically, the first interconnection line 66a may be shaped like a "U" lying laterally.

The second interconnection line 66b may be connected to the first interconnection line 66a by first contacts 65. The second interconnection line 66b may extend in a Y direction. Since the first interconnection line 66a is connected to the second interconnection line 66b by the first contacts 65, the interconnection line (66a, 66b) of the semiconductor device 2 according to the current embodiment can form a closed loop.

In an example embodiment, the second interconnection line 66b may be formed higher than the first interconnection line 66a. Specifically, the second interconnection line 66b may be formed higher than the first interconnection line 66a by a height of the first contacts 65. Although an interlayer insulating film is omitted from FIG. 9 for ease of understanding, the first and second interconnection lines 66a and 66b and the first contacts 65 may be surrounded by the interlayer insulating film.

In the semiconductor device 2, since the interconnection line (66a, 66b) forms a closed loop, electromigration in the interconnection line (66a, 66b) can be reduced as described above. Further, in the semiconductor device 2, an independent line not connected to the first interconnection line 66a can be additionally formed under the second interconnection line 66b.

A semiconductor device according to an example embodiment will now be described with reference to FIGS. 10 and 11.

Figure 10:
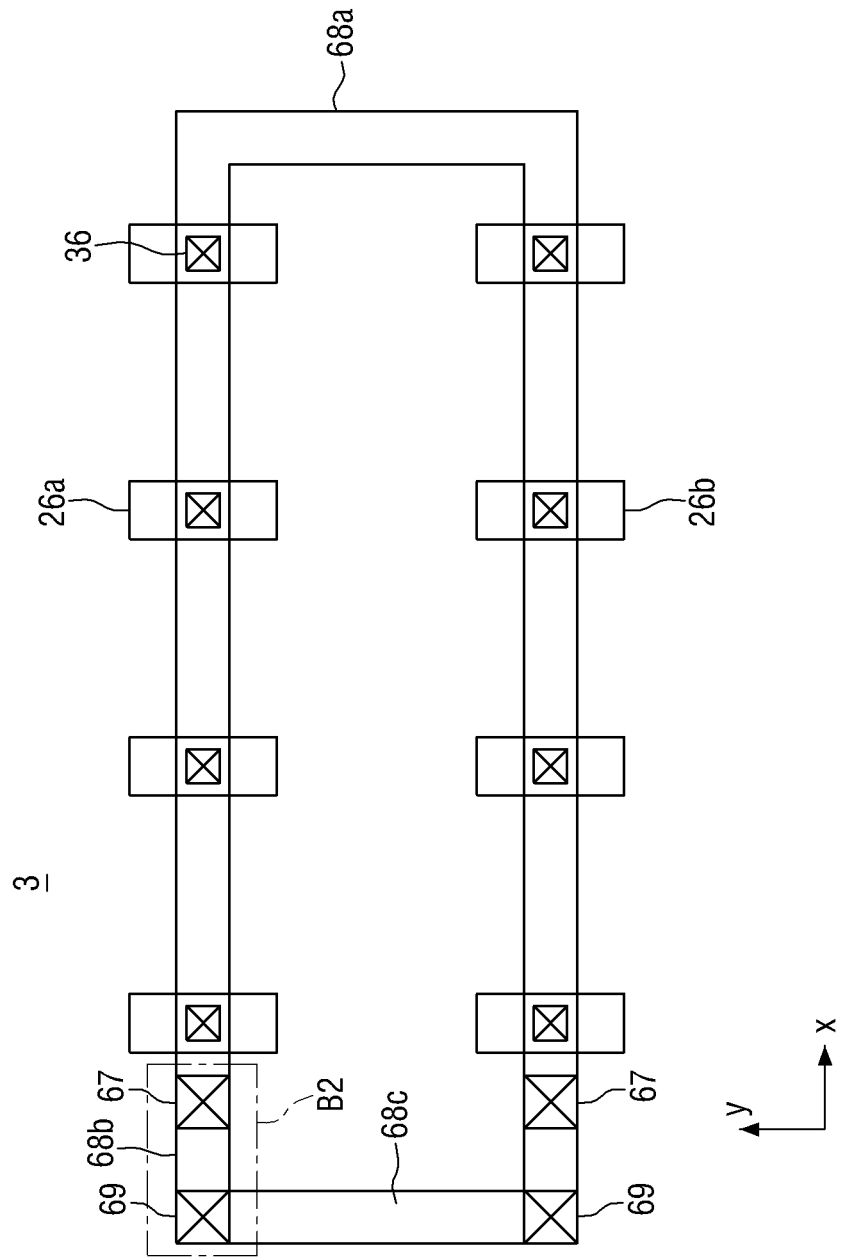
FIG. 10 is a partial layout diagram of a semiconductor device according to an example embodiment.

FIG. 10 is a partial layout diagram of a semiconductor device 3. FIG. 11 is a partial perspective view of a region B2 of FIG. 10. The current embodiment will hereinafter be described, focusing mainly on differences with the previous embodiments.

Figure 11:
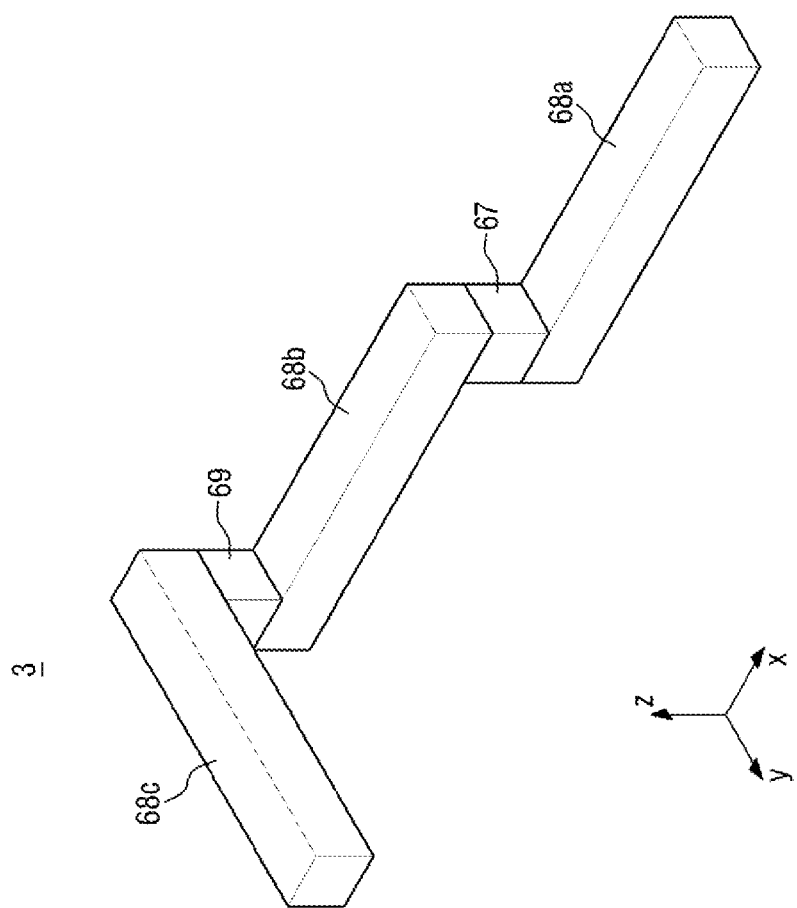
FIG. 11 is a partial perspective view of a region B2 of FIG. 10.

Referring to FIGS. 10 and 11, an interconnection line (68a, 68b, 68c) of the semiconductor device 3 may include a third interconnection line 68a, fourth interconnection lines 68b, and a fifth interconnection line 68c.

The third interconnection line 68a may be connected to first and second drain electrodes 26a and 26b by drain contacts 36. The third interconnection line 68a may extend toward a side of the first and second drain electrodes 26a and 26b.

The third interconnection line 68a may be U-shaped. Specifically, the third interconnection line 68a may be shaped like a "U" lying laterally.

The fourth interconnection lines 68b may extend in an X direction. The fourth interconnection lines 68b may extend toward the other side of among the first and second drain electrodes 26a and 26b.

The fourth interconnection lines 68b may be connected to the third interconnection line 68a by second contacts 67. In an example embodiment, the fourth interconnection lines 68b may be formed higher than the third interconnection line 68a. Specifically, the fourth interconnection lines 68b may be formed higher than the third interconnection line 68a by a height of the second contacts 67.

The fifth interconnection line 68c may be connected to the fourth interconnection lines 68b by third contacts 69. The fifth interconnection line 68c may extend in the Y direction. Since the fifth interconnection line 68c is connected to the fourth interconnection line 68b by the third contacts 69 and the fourth interconnection lines 68b are connected to the third interconnection line 68a by the second contacts 67, the interconnection line (68a, 68b, 68c) of the semiconductor device 3 according to the current embodiment can form a closed loop.

In an example embodiment, the fifth interconnection line 68c may be formed higher than the fourth interconnection lines 68b. Specifically, the fifth interconnection line 68c may be formed higher than the fourth interconnection lines 68b by a height of the third contacts 69. Although an interlayer insulating film is omitted from FIG. 11 for ease of understanding, the third through fifth interconnection lines 68a through 68c and the second and third contacts 67 and 69 may be surrounded by the interlayer insulating film.

In the semiconductor device 3, since the interconnection line (68a, 68b, 68c) forms a closed loop, electromigration in the interconnection line (68a, 68b, 68c) can be reduced as described above. Further, in the semiconductor device 3, independent lines not connected to the third interconnection line 68a can be additionally formed under the fourth and fifth interconnection lines 68b and 68c.

Figure 12:
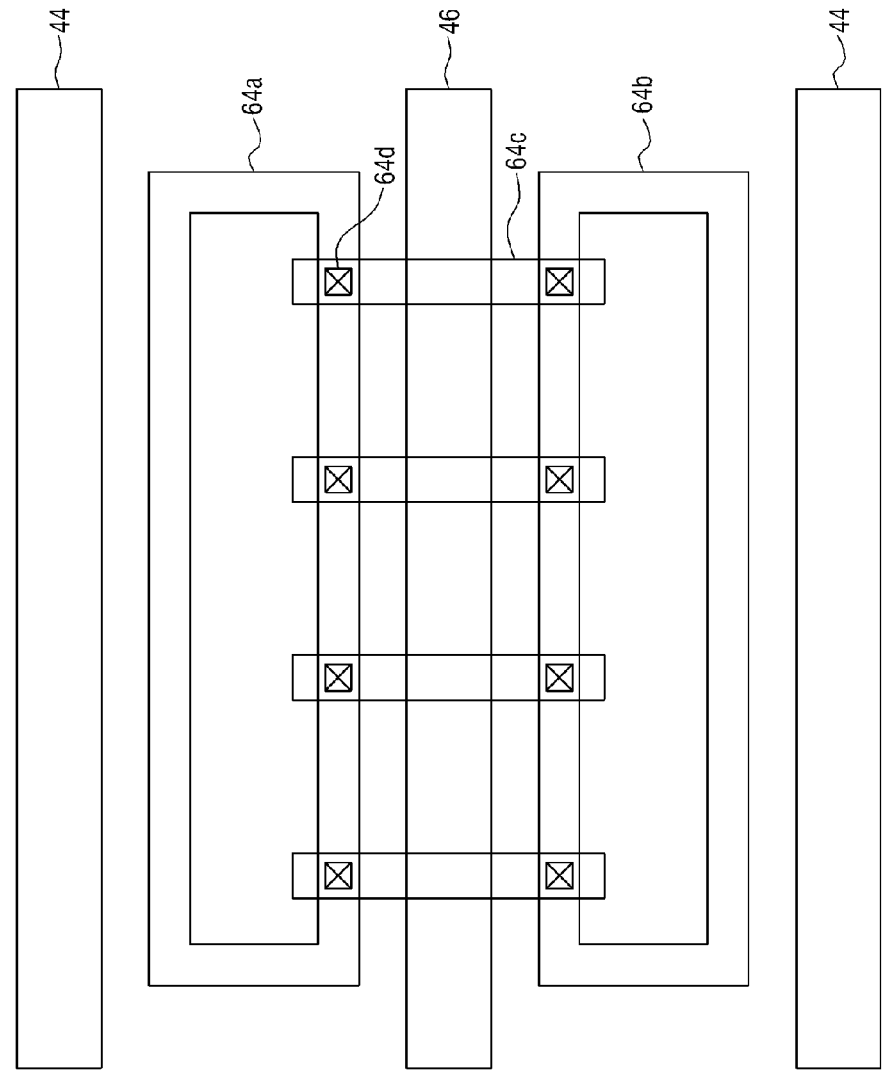
FIG. 12 is a partial layout diagram of a semiconductor device according to an example embodiment.

FIG. 12 is a partial layout diagram of a semiconductor device 4 according to another example embodiment. The current embodiment will hereinafter be described, focusing mainly on differences with the previous embodiments.

In the layout diagram of FIG. 12, only first and second power rails 44 and 46 and interconnection lines (64a, 64b) are illustrated for ease of description, among the elements of FIG. 1. In other words, the gate electrodes 22, the first and second source electrodes 24a and 24b, the first and second drain electrodes 26a and 26b, etc. formed between the first power rail 44 and the second power rail 46 of FIG. 1 are omitted from FIG. 12.

Referring to FIG. 12, the first power rail 44 of the semiconductor device 4 according to the current embodiment may also be disposed under the second power rail 46. The interconnection lines (64a, 64b) may include a sixth interconnection line 64a and a seventh interconnection line 64b which are separated from each other and form respective closed loops.

As described above, a plurality of PMOS transistors and a plurality of NMOS transistors may be formed between the first power rail 44 under the sixth interconnection line 64a and the second power rail 46. In addition, a plurality of PMOS transistors and a plurality of NMOS transistors may be formed between the first power rail 44 under the seventh interconnection line 64b and the second power rail 46.

Bridge lines 64c may connect the sixth interconnection line 64a and the seventh interconnection line 64b. Specifically, the bridge lines 64c may be connected to the sixth connection line 64a and the seventh interconnection line 64b by bridge contacts 64d. The bridge lines 64c may be formed higher than the sixth interconnection line 64a and the seventh interconnection line 64b. Specifically, the bridge lines 64c may be formed higher than the sixth interconnection line 64a and the seventh interconnection line 64b by a height of the bridge contacts 64d.

The bridge lines 64c may connect, in parallel, a plurality of transistors formed between the first power rail 44 under the sixth interconnection line 64a and the second power rail 46 to a plurality of transistors formed between the first power rail 44 under the seventh interconnection line 64b and the second power rail 46. In other words, the configuration of FIG. 12 can produce the semiconductor device 4 which includes more transistors than the semiconductor devices 1 through 3.

Although three bridge lines 64c connect the sixth interconnection line 64a and the seventh interconnection line 64b in FIG. 12, example embodiments are not limited thereto. The number of the bridge lines 64c can vary as desired.

In addition, although the sixth interconnection line 64a and the seventh interconnection line 64b which are separated from each other and form respective closed loops are arranged in a Y direction in FIG. 12, example embodiments are not limited thereto. In an example embodiment, the sixth interconnection line 64a and the seventh interconnection line 64b which are separated from each other and form respective closed loops may also be arranged in an X direction.

Figure 13:
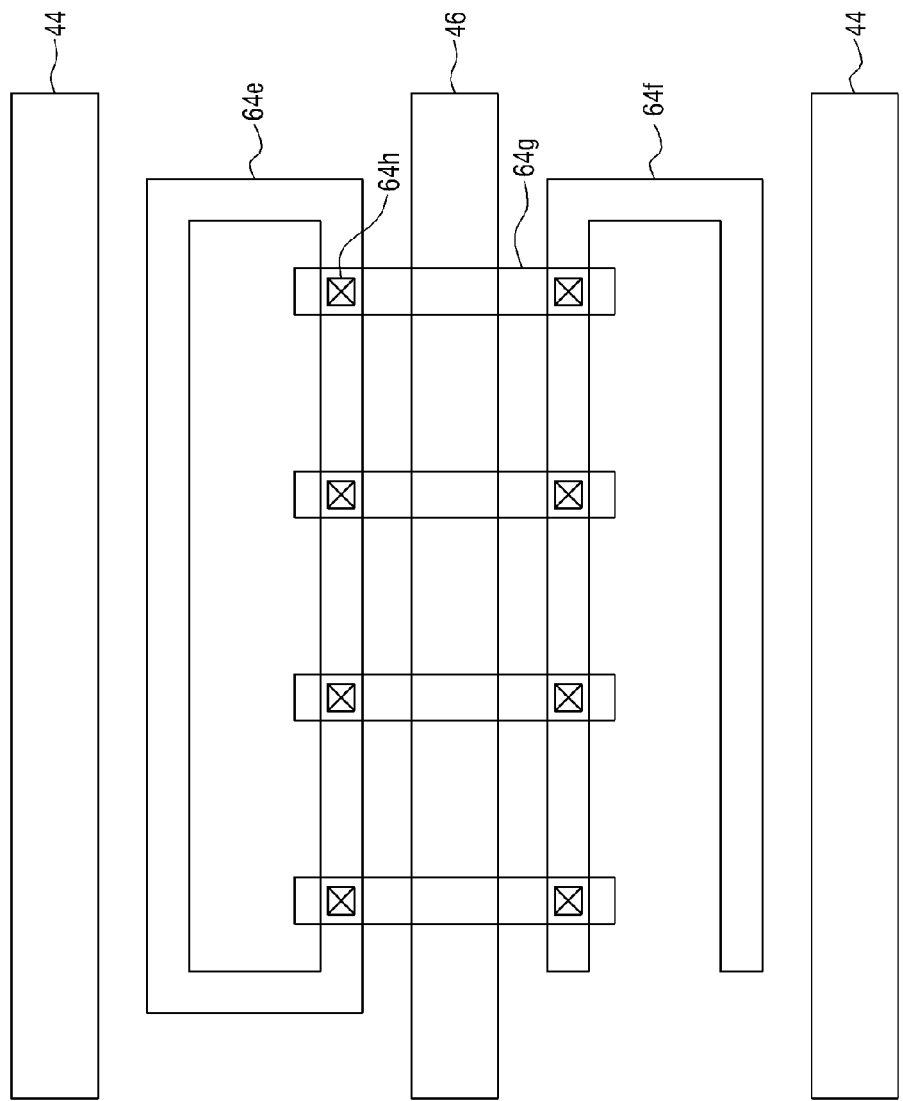
FIG. 13 is a partial layout diagram of a semiconductor device according to an example embodiment.

FIG. 13 is a partial layout diagram of a semiconductor device 5 according to another example embodiment. The current embodiment will hereinafter be described, focusing mainly on differences with the previous embodiments.

In the layout diagram of FIG. 13, only first and second power rails 44 and 46 and interconnection lines (64a, 64b) are illustrated for ease of description, among the elements of FIG. 1. In other words, the gate electrodes 22, the first and second source electrodes 24a and 24b, the first and second drain electrodes 26a and 26b, etc. formed between the first power rail 44 and the second power rail 46 of FIG. 1 are omitted from FIG. 13.

Referring to FIG. 13, an interconnection line (64e, 64f) of the semiconductor device 5 may include an eighth interconnection line 64e which forms a closed loop and a ninth interconnection line 64f which is U-shaped.

As described above, a plurality of PMOS transistors and a plurality of NMOS transistors may be formed between the first power rail 44 under the eighth interconnection line 64e and the second power rail 46. In addition, a plurality of PMOS transistors and a plurality of NMOS transistors may be formed between the first power rail 44 under the ninth interconnection line 64f and the second power rail 46.

Bridge lines 64g may connect the eighth interconnection line 64e and the ninth interconnection line 64f. Specifically, the bridge lines 64g may be connected to the eighth connection line 64e and the ninth interconnection line 64f by bridge contacts 64h. The bridge lines 64g may be formed higher than the eighth interconnection line 64e and the ninth interconnection line 64f. Specifically, the bridge lines 64g may be formed higher than the eighth interconnection line 64e and the ninth interconnection line 64f by a height of the bridge contacts 64h.

The bridge lines 64g may connect, in parallel, a plurality of transistors formed between the first power rail 44 under the eighth interconnection line 64e and the second power rail 46 to a plurality of transistors formed between the first power rail 44 under the ninth interconnection line 64f and the second power rail 46. In other words, the configuration of FIG. 13 can produce the semiconductor device 5 which includes more transistors than the semiconductor devices 1 through 3.

Although the eighth interconnection line 64e which forms a closed loop and the ninth interconnection line 64f which is U-shaped are arranged in a Y direction in FIG. 13, example embodiments are not limited thereto. In an example embodiment, the eighth interconnection line 64e and the ninth interconnection line 64f may also be arranged in an X direction.

A semiconductor device according to another example embodiment will now be described with reference to FIGS. 14 through 17.

Figure 14:
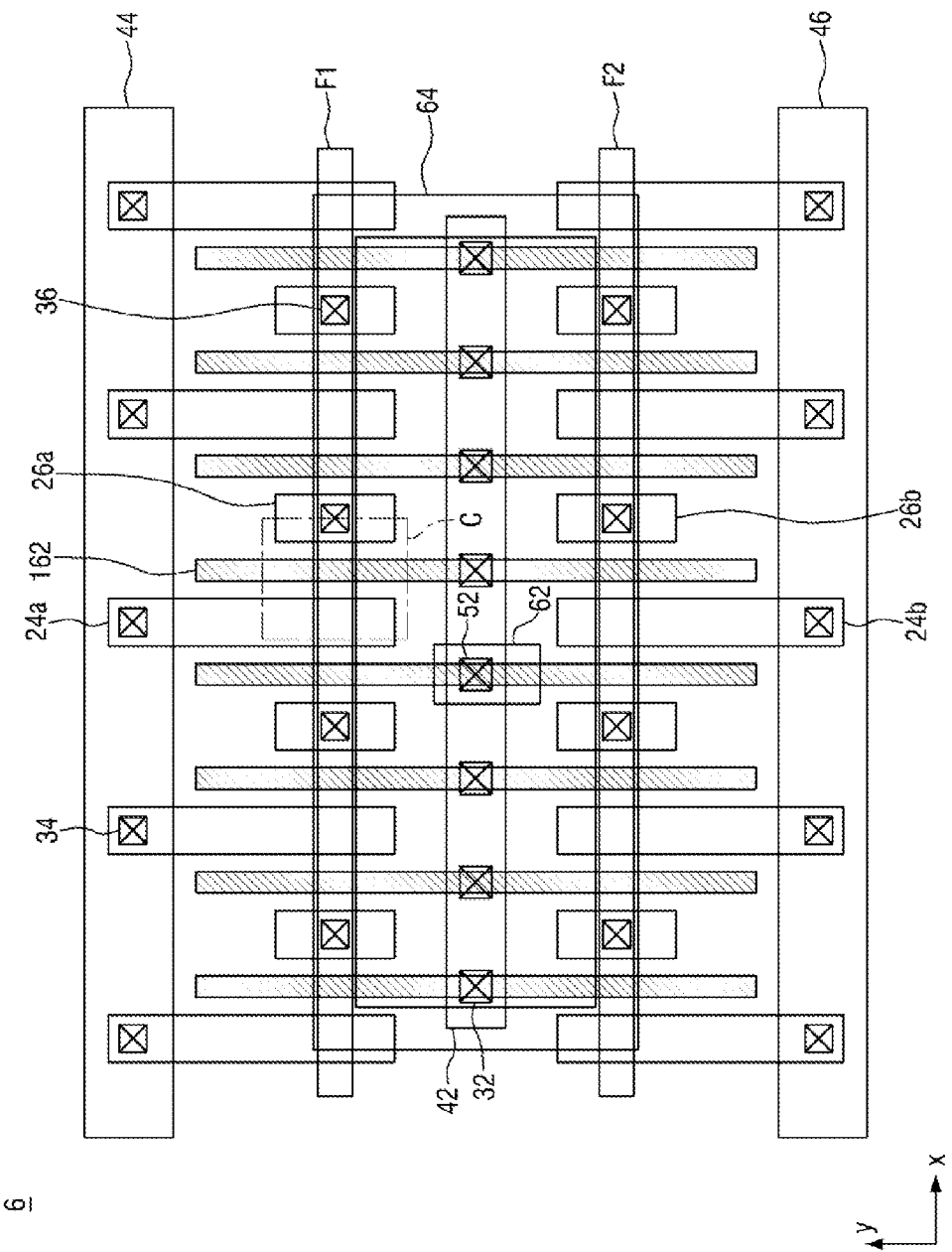
FIG. 14 is a layout diagram of a semiconductor device according to an example embodiment.
Figure 15:
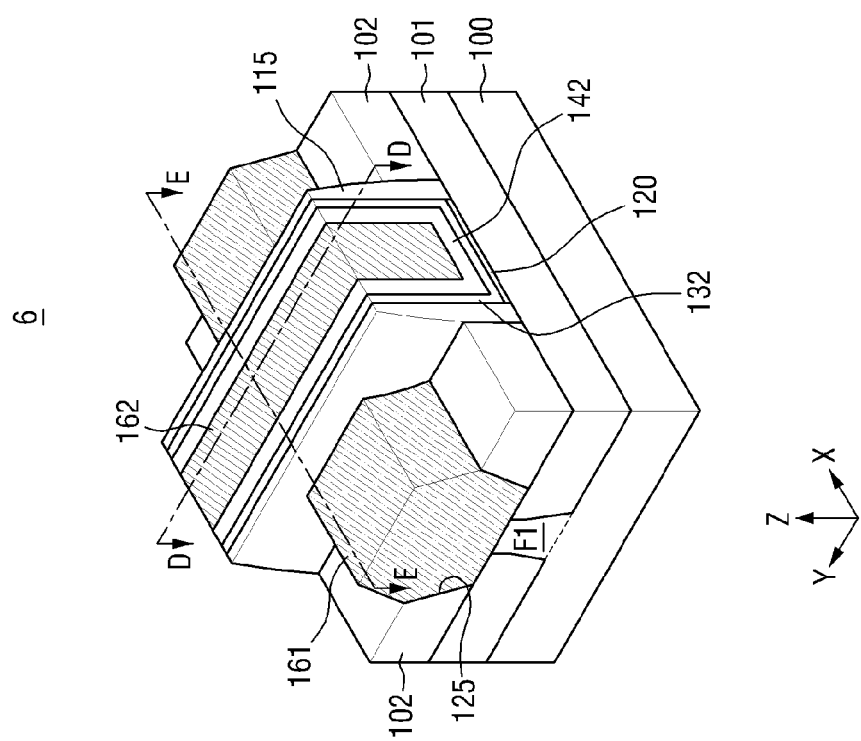
FIG. 15 is a partial perspective view of a region C of FIG. 14.
Figure 16:
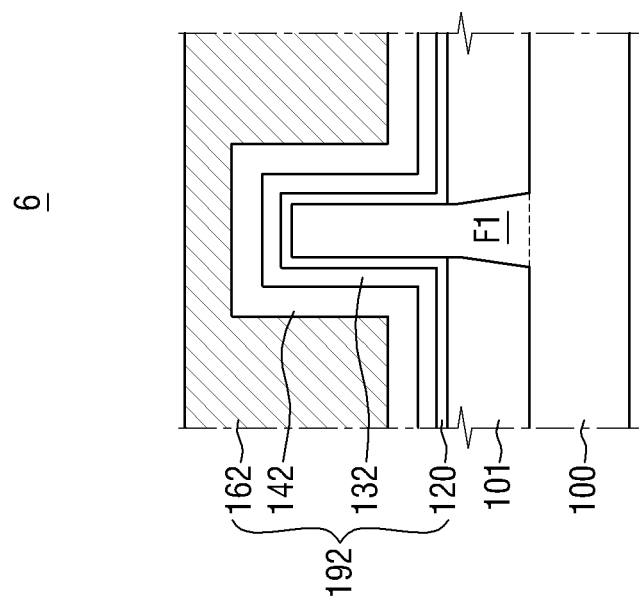
FIG. 16 is a cross-sectional view taken along the line D-D of FIG. 15.
Figure 17:
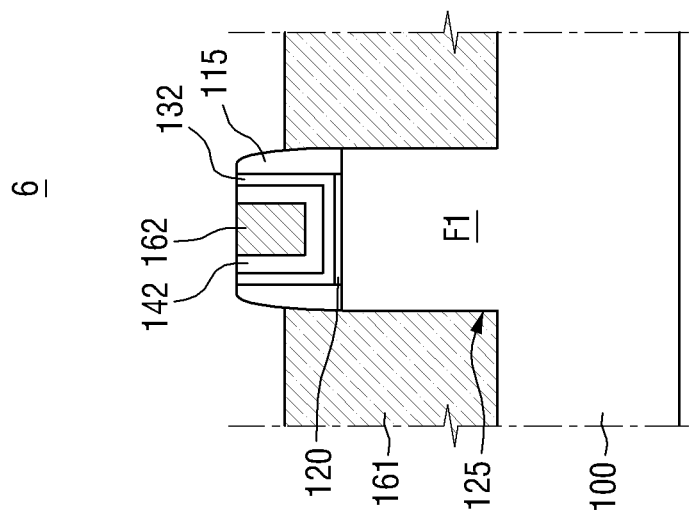
FIG. 17 is a cross-sectional view taken along the line E-E of FIG. 15.

FIG. 14 is a layout diagram of a semiconductor device 6 according to an example embodiment. FIG. 15 is a partial perspective view of a region C of FIG. 14. FIG. 16 is a cross-sectional view taken along the line D-D of FIG. 15. FIG. 17 is a cross-sectional view taken along the line E-E of FIG. 15.

A case where the semiconductor device 6 includes fin transistors (FinFETs) will hereinafter be described as an example. However, example embodiments are not limited to this case. Example embodiments are also applicable to a semiconductor device including three-dimensional semiconductor elements (e.g., transistors using nanowires) instead of fin transistors.

Referring to FIGS. 14 through 17, the semiconductor device 6 may further include first and second active fins F1 and F2 which extend in an X direction.

The first and second active fins F1 and F2 may protrude from an active layer 100 in a third direction Z. In some example embodiments, the first and second active fins F1 and F2 may be formed by partially etching the active layer 100. However, the example embodiments are not limited thereto.

In at least one example embodiment, the active layer 100 may be a semiconductor substrate. When the active layer 100 is a semiconductor substrate, the semiconductor substrate may be formed of one or more semiconductor materials selected from the group consisting of Si, Ge, SiGe, GaP, GaAs, SiC, SiGeC, InAs, and InP.

In at least one example embodiment, the active layer 100 may be an epitaxial layer formed of a semiconductor material. Here, the epitaxial layer may be formed on an insulating substrate. In other words, the active layer 100 may be an SOI substrate.

The first and second active fins F1 and F2 may extend in the X direction and may be separated from each other in a Y direction.

A pair of the first and second active fins F1 and F2 may form each group. This is because the two active fins F1 and F2 are formed from one dummy gate referred to as a mandrel.

First and second impurity regions 12 and 14 (see FIG. 1) may be formed in the first and second active fins F1 and F2.

A device isolation layer 101 may cover side surfaces of each of the first and second active fins F1 and F2. Specifically, the device isolation layer 101 may cover a lower part of each of the first and second active fins F1 and F2 as shown in FIGS. 15 and 16. The device isolation layer 101 may be, for example, an insulating layer. More specifically, the device isolation layer 101 may be, but is not limited to, a silicon oxide ($SiO_2$) layer, a silicon nitride (SiN) layer, or a silicon oxynitride (SiON) layer.

In the drawings, a cross-section of each of the first and second active fins F1 and F2 may be tapered, that is, may become wider from top to bottom. However, the cross-sectional shape of each of the first and second active fins F1 and F2 is not limited to the tapered shape. Each of the first and second active fins F1 and F2 may have a quadrangular cross-sectional shape. In other example embodiments, each of the first and second active fins F1 and F2 may have a chamfered cross-sectional shape. That is, corners of each of the first and second active fins F1 and F2 may be curved.

A gate structure 192 may be formed on each of the first and second active fins F1 and F2 to extend in the Y direction. Spacers 115 may be disposed on both sides of the gate structure 192. The spacers 115 may be disposed on each of the first and second active fins F1 and F2 to extend in the Y direction.

Transistors may be formed in part of each of the first and second active fins F1 and F2. Each of the transistors may include the gate structure 192, the spacers 115, and source/drain regions 161.

The gate structure 192 may include an interface layer 120, a gate insulating layer 132, a work function control layer 142, and a gate electrode 162 sequentially formed on each of the first and second active fins F1 and F2.

The interface layer 120 may be disposed on the device isolation layer 101 and each of the first and second active fins F1 and F2 to extend in the Y direction. The interface layer 120 may include a low-k material layer having a dielectric constant (k) of 9 or less, such as a silicon oxide layer (having a dielectric constant of approximately 4) or a silicon oxynitride layer (having a dielectric constant of approximately 4 to 8 depending on the content of oxygen atoms and nitrogen atoms). Alternatively, the interface layer 120 may be formed of silicate or a combination of the above example layers.

The gate insulating layer 132 may be disposed on the interface layer 120. Specifically, the gate insulating layer 132 may extend in the Y direction and partially cover an upper part of each of the first and second active fins F1 and F2. As shown in FIG. 17, the gate insulating layer 132 may extend upward along sidewalls of the spacers 115 disposed on both sides of the gate electrode 162. In FIG. 17, the gate insulating layer 132 is shaped as described above because it is formed by a replacement process (or a gate last process). However, example embodiments are not limited thereto, and the shape of the gate insulating layer 132 can vary as desired.

That is, in other example embodiments, the gate insulating layer 132 may be formed by a gate first process. Thus, the gate insulating layer 132 may not extend upward along the sidewalls of the spacers 115, unlike in FIG. 17.

The gate insulting layer 132 may be formed of a high-k material. In some example embodiments, the gate insulating layer 132 may be formed of, but not limited to $HfO_2$, $Al_2O_3$, $ZrO_2$, $TaO_2$, etc.

The work function control layer 142 may be disposed on the gate insulating layer 132. The work function control layer 142 may extend in the Y direction and partially cover the upper part of each of the first and second active fins F1 and F2. Like the gate insulating layer 132, the work function control layer 142 may extend upward along the sidewalls of the spacers 115. The work function control layer 142 is shaped as described above because it is formed by a replacement process (or a gate last process). However, example embodiments are not limited thereto, and the shape of the work function control layer 142 can vary as desired.

The work function control layer 142 may be a layer used to control the work function of a transistor. The work function control layer 142 may be at least one of an n-type work function control layer and a p-type work function control layer. When the work function control layer 142 is an n-type work function control layer, it may be, but is not limited to, TiAl, TiAlN, TaC, TaAlN, TiC, or HfSi. In some example embodiments, the work function control layer 142 formed on the second active fin F2 may include, for example, TiAl, TiAlN, TaC, TaAlN, TiC, or HfSi.

When the work function control layer 142 is a p-type work function control layer, it may include, for example, metal nitride. Specifically, the work function control layer 142 may include at least one of TiN and TaN. More specifically, the work function control layer 142 may be, but is not limited to, a single layer formed of TiN or a double layer composed of a TiN lower layer and a TaN upper layer. In some example embodiments, the work function control layer 142 formed on the first active fin F1 may be, but is not limited to, a single layer formed of TiN or a double layer composed of a TiN lower layer and a TaN upper layer.

The gate electrode 162 may be disposed on the work function control layer 142. The gate electrode 162 may extend in the Y direction and partially cover the upper part of each of the first and second active fins F1 and F2.

The gate electrode 162 may include a highly conductive material. In some example embodiments, the gate electrode 162 may include a metal. Examples of the metal may include, but not limited to, Al and W.

Recesses 125 may be formed in each of the first and second active fins F1 and F2 on both sides of the gate structure 192. Each of the recesses 125 may have sloping sidewalls. Thus, the recesses 125 may become wider as the distance from the active layer 100 increases. As shown in FIG. 15, the recesses 125 may be wider than the first and second active fins F1 and F2.

The source/drain regions 161 may be formed in the recesses 125, respectively. In some example embodiments, the source/drain regions 161 may be elevated source/drain regions. That is, top surfaces of the source/drain regions 161 may be higher than top surfaces of the first and second active fins F1 and F2. In addition, the source/drain regions 161 may be insulated from the gate structure 192 by the spacers 115.

In the case of a p-type transistor, the source/drain regions 161 may include a compressive stress material. The compressive stress material may be a material (e.g., SiGe) having a greater lattice constant than Si. The compressive stress material can improve the mobility of carriers in a channel region by applying compressive stress to each of the first and second active fins F1 and F2. In some example embodiments, the source/drain regions 161 formed on the first active fin F1 may include the compressive stress material.

In the case of an n-type transistor, the source/drain regions 161 may include the same material as the active layer 100 or a tensile stress material. For example, when the active layer 100 includes Si, the source/drain regions 161 may include Si or a material (e.g., SiC) having a smaller lattice constant than Si. In some example embodiments, the source/drain regions 161 formed on the second active fin F2 may include the tensile stress material.

In an example embodiment, the recesses 125 are formed in each of the first and second active fins F1 and F2, and the source/drain regions 161 are formed in the recesses 125. However, example embodiments are not limited thereto. In some other example embodiments, the source/drain regions 161 may be formed in each of the first and second active fins F1 and F2 by injecting impurities directly into each of the first and second active fins F1 and F2.

First and second source electrodes 24a and 24b and first and second drain electrodes 26a and 26b may be formed on the source/drain regions 161. Specifically, the first source electrode 24a and the first drain electrode 26a may be formed on the source/drain regions 161 formed on the first active fin F1, and the second source electrode 24b and the second drain electrode 26b may be formed on the source/drain regions 161 formed on the second active fin F2.

Although only part of an interlayer insulating film 102 is illustrated in FIG. 15 for ease of understanding, the interlayer insulating film 102 may cover the source/drain regions 161 and the gate structure 192.

In an example embodiment, a plurality of PMOS fin transistors formed on the first active fin F1 and a plurality of NMOS fin transistors formed on the second active fin F2 may form an inverter as described above with reference to FIG. 1. Other elements of the semiconductor device 6 have been fully described above with reference to FIG. 1, and thus a redundant description thereof will be omitted.

A semiconductor device according to another example embodiment will now be described with reference to FIG. 18.

Figure 18:
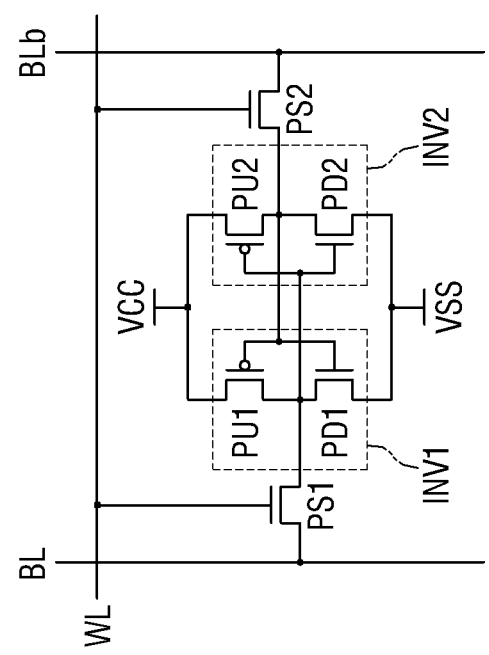
FIG. 18 is a circuit diagram of a semiconductor device according to an example embodiment.

FIG. 18 is a circuit diagram of a semiconductor device 7.

A 6T static random access memory (SRAM) device including six transistors will hereinafter be described as an example of the semiconductor device 7, but example embodiments are not limited thereto.

Referring to FIG. 18, the semiconductor device 7 may include a pair of first and second inverters INV1 and INV2 connected in parallel between a power source node VCC and a ground node VSS and first and second pass transistors PS1 and PS2 respectively connected to output nodes of the first and second inverters INV1 and INV2. The first and second pass transistors PS1 and PS2 may be connected to a bit line BL and a complementary bit line BLb, respectively. Gates of the first and second pass transistors PS1 and PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be PMOS transistors, and the first and second pull-down transistors PD1 and PD2 may be NMOS transistors.

An input node of the first inverter INV1 is connected to the output node of the second inverter INV2, and an input node of the second inverter INV2 is connected to the output node of the first inverter INV1 so as for the first and second inverters INV1 and INV2 to form a single latch circuit.

Each of the semiconductor devices 1 through 6 according to the above-described embodiments can be employed as at least one of the first inverter INV1 and the second inverter INV2. Specifically, at least one of the first pull-up transistor PU1 and the second pull-up transistor PU2 may consist of a plurality of PMOS transistors which are connected to an interconnection line 64 (e.g., see FIG. 1) by first drain electrodes 26a (e.g., see FIG. 1). In addition, at least one of the first pull-down transistor PD1 and the second pull-down transistor PD2 may consist of a plurality of NMOS transistors which are connected to the interconnection line 64 (see FIG. 1) by second drain electrodes 26b (e.g., see FIG. 1).

A semiconductor device according to another example embodiment will now be described with reference to FIG. 19.

Figure 19:
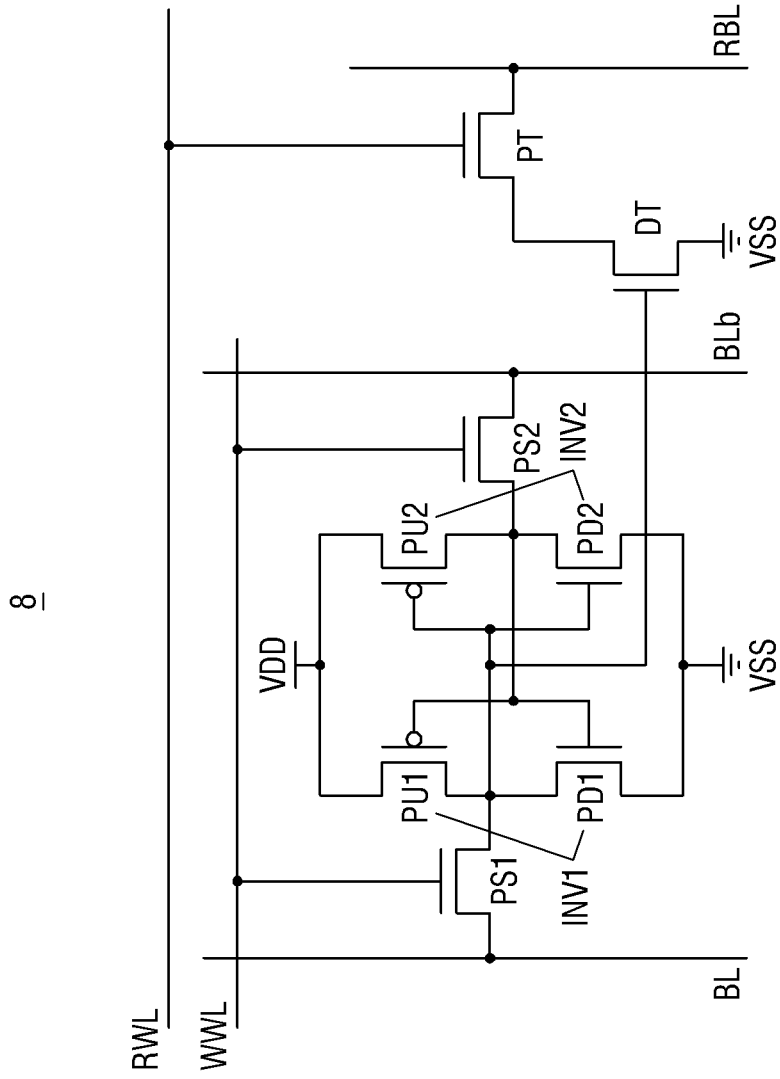
FIG. 19 is a circuit diagram of a semiconductor device according to an example embodiment.

FIG. 19 is a circuit diagram of a semiconductor device 8.

An 8T SRAM device including eight transistors will hereinafter be described as an example of the semiconductor device 8, but example embodiments are not limited thereto.

Referring to FIG. 19, the semiconductor device 8 may include a pair of first and second inverters INV1 and INV2 connected in parallel between a power source node VCC and a ground node VSS, first and second select transistors PS1 and PS2 respectively connected to output nodes of the first and second inverters INV1 and INV2, a drive transistor DT which is controlled by an output of the first inverter INV1, and a pass transistor PT which is connected to an output node of the drive transistor DT.

The first and second select transistors PS1 and PS2 may be connected to a bit line BL and a complementary bit line BLb, respectively. Gates of the first and second select transistors PS1 and PS2 may be connected to a write word line WWL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first and second pull-up transistors PU1 and PU2 may be p-type field effect transistors (PFETs), and the first and second pull-down transistors PD1 and PD2 may be n-type field effect transistors (NFETs).

An input node of the first inverter INV1 is connected to the output node of the second inverter INV2, and an input node of the second inverter INV2 is connected to the output node of the first inverter INV1 so as for the first and second inverters INV1 and INV2 to form a single latch circuit.

The drive transistor DT and the pass transistor PT may be used to read data stored in the latch circuit formed by the first inverter INV1 and the second inverter INV2. A gate of the drive transistor DT may be connected to the output node of the first inverter INV1, and a gate of the pass transistor PT may be connected to a read word line RWL. An output of the drive transistor Dl may be connected to the ground node VSS, and an output of the pass transistor PT may be connected to a read bit line RBL.

The circuit configuration of the semiconductor device 8 ac makes it possible to access data stored in the SRAM device through two ports (e.g., a double port).

For example, by selecting the write word line WWL, the bit line BL, and the complementary bit line BLb, it is possible to write data to the latch circuit formed by the first inverter INV1 and the second inverter INV2 or read data stored in the latch circuit. In addition, by selecting the read word line RWL and the read bit line RBL, it is possible to read data stored in the latch circuit formed by the first inverter INV1 and the second inverter INV2.

In the SRAM device, an operation of reading data through a second port can be performed independently of an operation of a first port. Therefore, such operation may not affect data stored in the latch circuit. In other words, an operation of reading data stored in the latch circuit and an operation of writing data to the latch circuit can be performed independently.

Each of the semiconductor devices 1 through 6 according to the above-described example embodiments can be employed as at least one of the first inverter INV1 and the second inverter INV2. Specifically, at least one of the first pull-up transistor PU1 and the second pull-up transistor PU2 may consist of a plurality of PMOS transistors which are connected to an interconnection line 64 (e.g., see FIG. 1) by first drain electrodes 26a (e.g., see FIG. 1). In addition, at least one of the first pull-down transistor PD1 and the second pull-down transistor PD2 may consist of a plurality of NMOS transistors which are connected to the interconnection line 64 (see FIG. 1) by second drain electrodes 26b (e.g., see FIG. 1).

A wireless communication device including semiconductor devices according to example embodiments will now be described with reference to FIG. 20.

FIG. 20 is a block diagram of a wireless communication device 900 including semiconductor devices according to an example embodiment.

Referring to FIG. 20, the wireless communication device 900 may be a cellular phone, a smartphone terminal, a handset, a personal digital assistant (PDA), a laptop computer, a video game unit, or some other device. The device 900 may use Code Division Multiple Access (CDMA), Time Division Multiple Access (TDMA), such as Global System for Mobile communications (GSM), or some other wireless communication standard.

The device 900 may provide bidirectional communication via a receive path and a transmit path. On the receive path, signals transmitted by one or more base stations may be received by an antenna 911 and provided to a receiver (RCVR) 913. The RCVR 913 conditions and digitizes the received signal and provides samples to a digital section 120 for further processing. On the transmit path, a transmitter (TMTR) 915 receives data transmitted from the digital section 120, processes and conditions the data, generates a modulated signal, and transmits the modulated signal to one or more base stations via the antenna 911.

The digital section 920 may be implemented with one or more digital signal processors (DSPs), microprocessors, reduced instruction set computers (RISCs), etc. In addition, the digital section 920 may be fabricated on one or more application specific integrated circuits (ASICs) or some other type of integrated circuits (ICs).

The digital section 920 may include various processing and interface units such as, for example, a modem processor 934, a video processor 922, an application processor 924, a display processor 928, a controller/multi-core processor 926, a central processing unit (CPU) 930, and an external bus interface (EBI) 932.

The video processor 922 may perform processing for graphics applications. Generally, the video processor 922 may include any number of processing units or modules for any set of graphics operations. Certain portions of the video processor 922 may be implemented in firmware and/or software. For example, a control unit may be implemented with firmware and/or software modules (e.g., procedures, functions, etc.) that perform functions described herein. The firmware and/or software codes may be stored in a memory and executed by a processor (e.g., the multi-core processor 926). The memory may be implemented inside or outside the processor.

The video processor 922 may implement a software interface such as Open Graphics Library (OpenGL), Direct3D, etc. The CPU 930 may execute a series of graphics processing operations, together with the video processor 922. The controller/multi-core processor 926 may include two or more cores. The controller/multi-core processor 926 may allocate a workload to be processed to two cores according to the workload and process the workload simultaneously.

In the drawing, the application processor 924 is illustrated as an element of the digital section 920. However, example embodiments are not limited thereto. In some example embodiments, the digital section 920 may be integrated into one application processor 924 or one application chip.

The modem processor 934 may perform operations needed to deliver data between the RCVR 913 and the TMTR 915 and the digital section 920. The display processor 928 may perform operations needed to drive a display 910.

The semiconductor devices 1 through 8 may be directly employed in the processors 922, 924, 926, 928, 930 and 934 or may be used as a cache memory utilized for the operations of the processors 922, 924, 926, 928, 930 and 934.

A system on chip (SoC) system including semiconductor devices according to example embodiments will now be described with reference to FIGS. 21A through 21C.

Figure 21A:
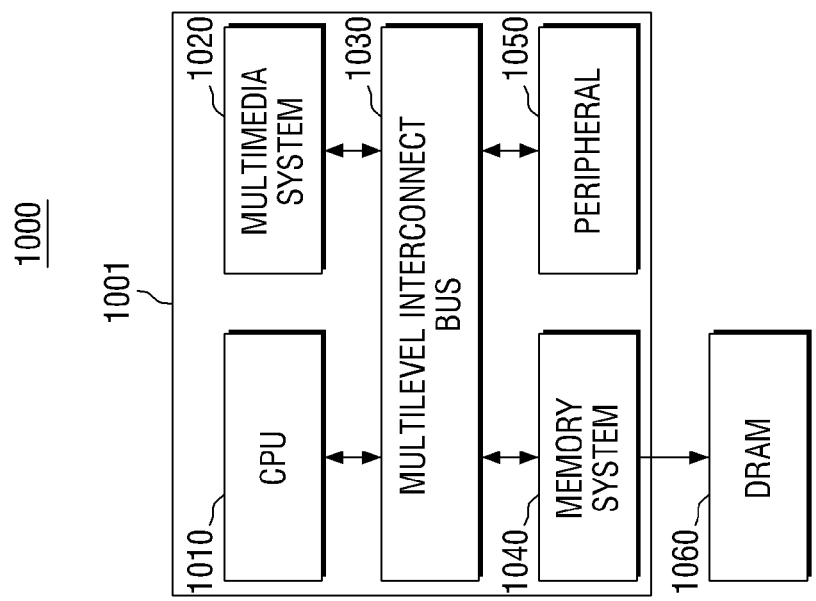
FIG. 21A is a block diagram of a system on chip (SoC) system including semiconductor devices according to example embodiments.

FIG. 21A is a block diagram of a SoC system 1000 including semiconductor devices according to example embodiments. FIG. 21B is a schematic block diagram of a CPU 1010 of FIG. 21A. FIG. 21C is a diagram illustrating a semiconductor device of FIG. 21A after being packaged.

Referring to FIG. 21A, the SoC system 1000 includes an application processor 1001 and a dynamic random access memory (DRAM) 1060.

The application processor 1001 may include the CPU 1010, a multimedia system 1020, a bus 1030, a memory system 1040, and a peripheral circuit 1050.

The CPU 1010 may perform operations needed to drive the SoC system 1000. In some example embodiments, the CPU 1010 may be configured as a multi-core environment including a plurality of cores.

Figure 21B:
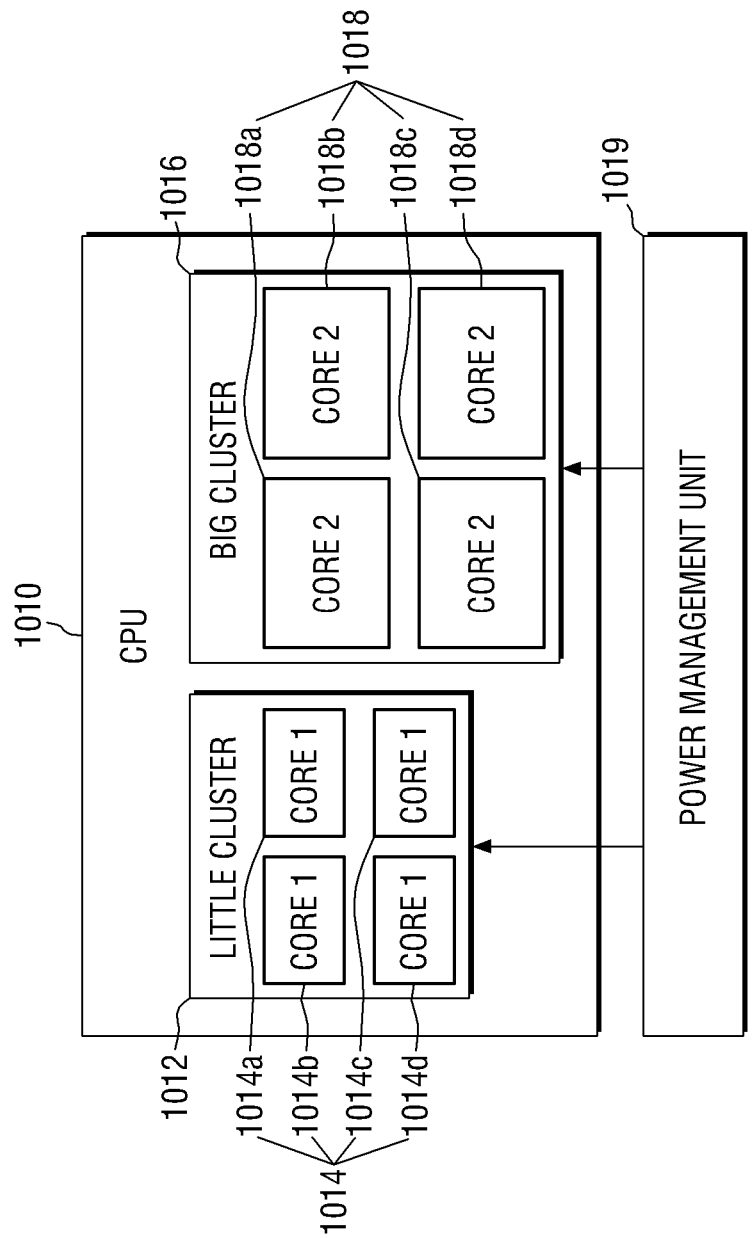
FIG. 21B is a schematic block diagram of a central processing unit (CPU) of FIG. 21A.

In some example embodiments, the CPU 1010 may include a first cluster 1012 and a second cluster 1016 as shown in FIG. 21B.

The first cluster 1012 may be placed in the CPU 1010 and include n (where n is a natural number) first cores 1014. In FIG. 21B, for ease of description, a case where the first cluster 1012 includes four (i.e., n=4) first cores 1014a through 1014d will be described as an example. However, example embodiments are not limited to this case.

The second cluster 1016 may also be placed in the CPU 1010 and include n second cores 1018. The second cluster 1016 may be separated from the first cluster 1012. For ease of description, a case where the second cluster 1016 includes four (i.e., n=4) second cores 1018a through 1018d will be described as an example. However, example embodiments are not limited to this case.

In FIG. 21B, the number of the first cores 1014 included in the first cluster 1012 is equal to the number of the second cores 1018 included in the second cluster 1016. However, example embodiments are not limited thereto. In some embodiments, the number of the first cores 1014 included in the first cluster 1012 may also be different from the number of the second cores 1018 included in the second cluster 1016.

In addition, in FIG. 21B, only the first cluster 1012 and the second cluster 1016 are placed in the CPU 1010. However, example embodiments are not limited thereto. When necessary, a third cluster (not shown) which is separate from the first and second clusters 1012 and 1016 and includes third cores (not shown) may additionally be placed in the CPU 1010.

In the current embodiment, the amount of computation per unit time of the first cores 1014 included in the first cluster 1012 may be different from the amount of computation per unit time of the second cores 1018 included in the second cluster 1016.

In some example embodiments, the first cluster 1012 may be a little cluster, and the second cluster 1016 may be a big cluster. In this case, the amount of computation per unit time of the first cores 1014 included in the first cluster 1012 may be smaller than the amount of computer per unit time of the second cores 1018 included in the second cluster 1016.

Therefore, the amount of computation per unit time in a case where all first cores 1014 included in the first cluster 1012 are enabled to perform an operation may be smaller than the amount of computation per unit time in a case where all second cores 1018 included in the second cluster 1016 are enabled to perform an operation.

The respective amounts of computation per unit time of the $(1-1)^{th}$ through $(1-4)^{th}$ cores 1014a through 1014d included in the first cluster 1012 may be equal, and the respective amounts of computation per unit time of the $(2-1)^{th}$ through $(2-4)^{th}$ cores 1018a through 1018d included in the second cluster 1016 may be equal. That is, assuming that the amount of computation per unit time of each of the $(1-1)^{th}$ through $(1-4)^{th}$ cores 1014a through 1014d is 10, the amount of computation per unit time of each of the $(2-1)^{th}$ through $(2-4)^{th}$ cores 1018a through 1018d may be 40.

A power management unit 1019 may enable or disable the first cluster 1012 and the second cluster 1016 as necessary. Specifically, when an operation needs to be performed by the first cluster 1012, the power management unit 1019 may enable the first cluster 1012 and disable the second cluster 1016. On the contrary, when an operation needs to be performed by the second cluster 1016, the power management unit 1019 may enable the second cluster 1016 and disable the first cluster 1012. When the amount of computation required can be fully processed by the $(1-1)^{th}$ core 1014a, the power management unit 1019 may enable the first cluster 1014a and disable the second cluster 1016. Even within the first cluster 1012, the power management unit 1019 may enable the $(1-1)^{th}$ core 1014a and disable the $(1-2)^{th}$ through $(1-4)^{th}$ cores 1014b through 1014d. In other words, the power management unit 1019 may determine whether to enable the first cluster 1012 and the second cluster 1016 and may also determine whether to enable each of the $(1-1)^{th}$ through $(1-4)^{th}$ cores 1014a through 1014d included in the first cluster 1012 and each of the $(2-1)^{th}$ through $(2-4)^{th}$ cores 1018a through 1018d included in the second cluster 1016.

In some example embodiments, the power management unit 1019 may enable the first and second clusters 1012 and/or the cores 1014a through 1014d and 1018a through 1018d included in the first and second clusters 1012 and 1016 by supplying power to the first and second clusters 1012 and/or the cores 1014a through 1014d and 1018a through 1018d included in the first and second clusters 1012 and 1016. In addition, the power management unit 1019 may disable the first and second clusters 1012 and/or the cores 1014a through 1014d and 1018a through 1018d included in the first and second clusters 1012 and 1016 by cutting the power supply to the first and second clusters 1012 and/or the cores 1014a through 1014d and 1018a through 1018d included in the first and second clusters 1012 and 1016.

The power management unit 1019 may enable only a specific cluster 1012 or 1016 and/or the cores 1014a through 1014d or 1018a through 1018d included in the specific cluster 1012 or 1016 according to the operating environment of the SoC system 1000, thereby managing the power consumption of the entire SoC system 100.

Referring back to FIG. 21A, the multimedia system 1020 may be used to perform various multimedia functions in the SoC system 1000. The multimedia system 1020 may include a 3D engine module, a video codec, a display system, a camera system, a post-processor, etc.

The bus 1030 may be used for data communication among the CPU 1010, the multimedia system 1020, the memory system 1040 and the peripheral circuit 1050. In some example embodiments, the bus 1030 may have a multilayer structure. Specifically, the bus 1030 may be, but is not limited to, a multilayer advanced high-performance bus (AHB) or a multilayer advanced extensible interface (AXI).

The memory system 1040 may provide an environment needed for the application processor 1001 to be connected to an external memory (e.g., the DRAM 1060) and operate at high speed. In some example embodiments, the memory system 1040 may include a controller (e.g., a DRAM controller) needed to control the external memory (e.g., the DRAM 1060).

The peripheral circuit 1050 may provide an environment needed for the SoC system 1000 to smoothly connect to an external device (e.g., mainboard). Accordingly, the peripheral circuit 1050 may include various interfaces that enable the external device connected to the SoC system 1000 to be compatible with the SoC system 1000.

The DRAM 1060 may function as an operating memory needed for the operation of the application processor 1001. In some example embodiments, the DRAM 1060 may be placed outside the application processor 1001. Specifically, the DRAM 1060 may be packaged with the application processor 1001 in the form of package on package (PoP) as shown in FIG. 21C.

Figure 21C:
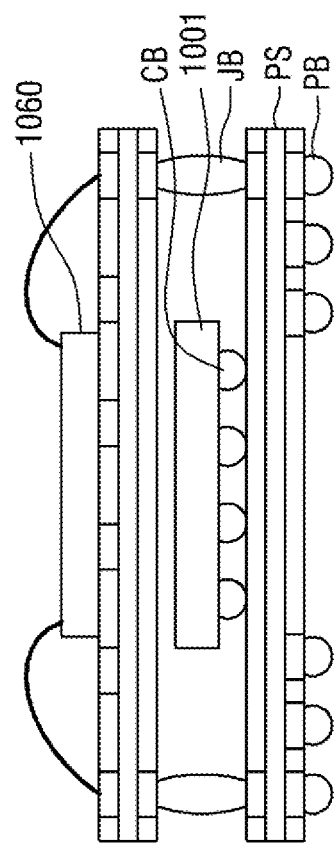
FIG. 21C is a diagram illustrating a semiconductor device of FIG. 21A after being packaged.

Referring to FIG. 21C, the semiconductor package may include a package substrate PS, the DRAM 1060, and the application processor 1001.

The package substrate PS may include a plurality of package balls PB. The package balls PB may be electrically connected to chip balls CB of the application processor 1001 by signal lines within the package substrate PS and may be electrically connected to joint balls JB by signal lines within the package substrate PS.

The DRAM 1060 may be electrically connected to the joint balls JB by wire bonding.

The application processor 1001 may be disposed under the DRAM 1060. The chip balls CB of the application processor 1001 may be electrically connected to the DRAM 1060 by the joint balls JB.

In FIG. 21A, the DRAM 1060 is placed outside the application processor 1001. However, example embodiments are not limited thereto. When necessary, the DRAM 1060 may also be placed inside the application processor 1001.

Any one of the semiconductor devices 1 through 8 can be provided as any one of the elements of the SoC system 1000.

An electronic system including semiconductor devices according to example embodiments will now be described with reference to FIG. 22.

FIG. 22 is a block diagram illustrating an electronic system 1100 including semiconductor devices according to example embodiments.

Referring to FIG. 22, the electronic system 1100 may include a controller 1110, an input/output (I/O) device 1120, a memory device 1130, an interface 1140 and a bus 1150. The controller 1110, the I/O device 1120, the memory device 1130 and/or the interface 1140 may be connected to one another by the bus 1150. The bus 1150 may serve as a path for transmitting data.

The controller 1110 may include at least one of a microprocessor, a digital signal processor, a microcontroller and logic devices capable of performing similar functions to those of a microprocessor, a digital signal processor and a microcontroller. The I/O device 1120 may include a keypad, a keyboard and a display device. The memory device 1130 may store data and/or commands. The interface 1140 may be used to transmit data to or receive data from a communication network. The interface 1140 may be a wired or wireless interface. In an example, the interface 1140 may include an antenna or a wired or wireless transceiver.

Although not shown in the drawing, the electronic system 1100 may be an operating memory for improving the operation of the controller 1110, and may also include a high-speed DRAM or SRAM. Here, any one of the semiconductor devices 1 through 8 may be employed as the operating memory. In addition, any one of the semiconductor devices 1 through 8 may be provided in the memory device 1130 or in the controller 1110 or the I/O device 1120.

The electronic system 1100 may be applied to nearly all types of electronic products capable of transmitting or receiving information in a wireless environment, such as a PDA, a portable computer, a web tablet, a wireless phone, a mobile phone, a digital music player, a memory card, etc.

Figure 23:
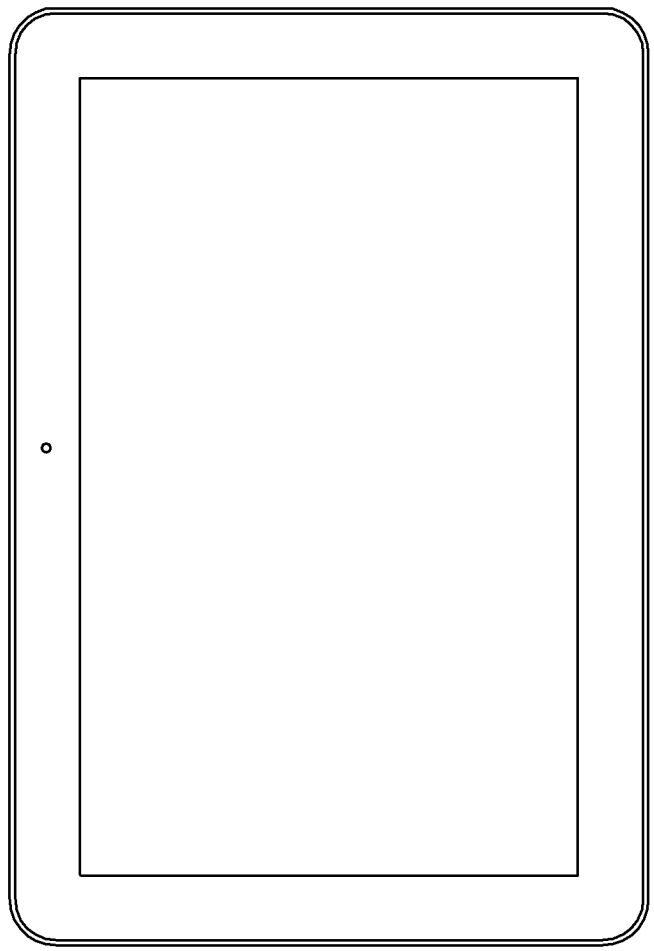
FIGS. 23 through 25 are diagrams illustrating examples of a semiconductor system to which semiconductor devices according to example embodiments can be applied.
Figure 24:
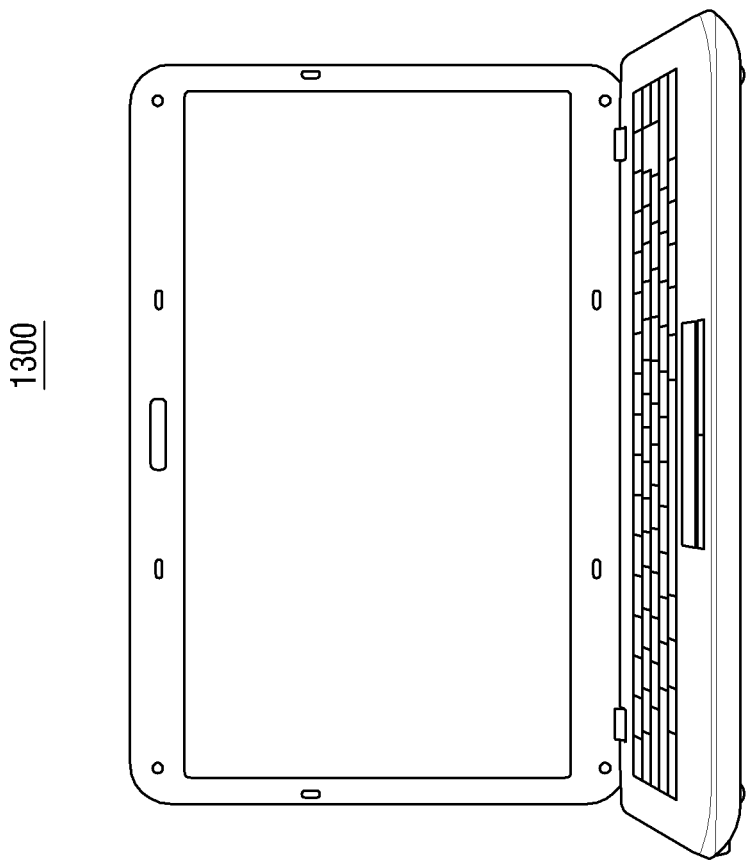
Figure 25:
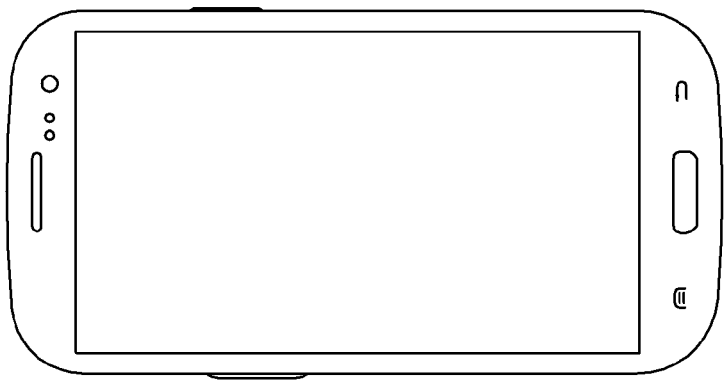

FIGS. 23 through 25 are diagrams illustrating examples of a semiconductor system to which semiconductor devices according to example embodiments can be applied.

FIG. 23 illustrates a tablet personal computer (PC) 1200, FIG. 24 illustrates a notebook computer 1300, and FIG. 25 illustrates a smartphone 1400. At least one of the semiconductor devices 1 through 8 according to the above-described example embodiments, as set forth herein, may be used in the tablet PC 1200, the notebook computer 1300, and the smartphone 1400.

The semiconductor devices 1 through 8, as set forth herein, may also be applied to various IC devices other than those set forth herein. That is, while the tablet PC 120, the notebook computer 1300, and the smartphone 1400 have been described above as examples of a semiconductor system according to an example embodiment, the examples of the semiconductor system according to the embodiment are not limited to the tablet PC 1200, the notebook computer 1300, and the smartphone 1400. In some example embodiments, the semiconductor system may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

A method of fabricating a semiconductor device according to an example embodiment will now be described with reference to FIG. 26.

Figure 26:
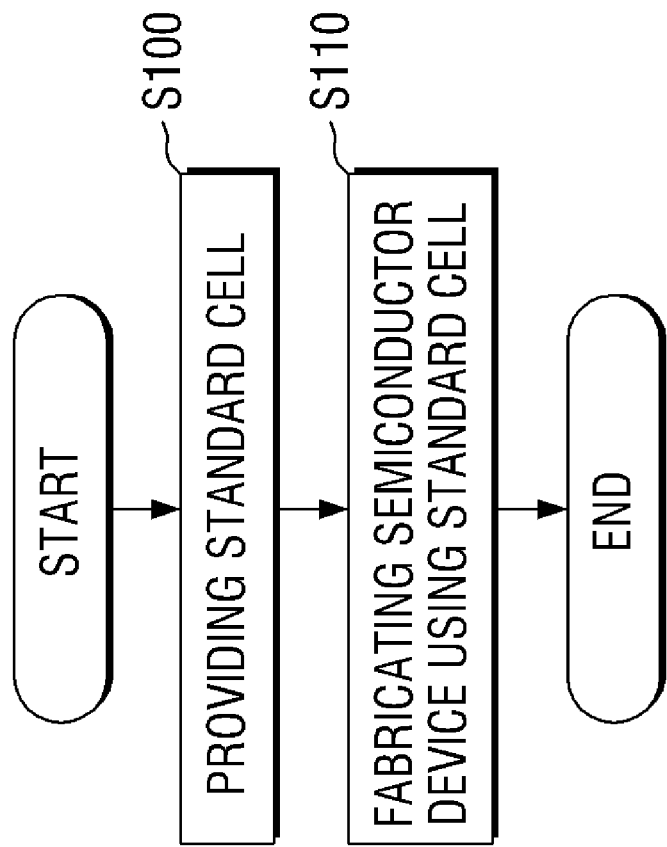
FIG. 26 is a flowchart illustrating a method of fabricating a semiconductor device according to an example embodiment.

FIG. 26 is a flowchart illustrating a method of fabricating a semiconductor device according to an example embodiment.

Referring to FIG. 26, a standard cell is provided (operation S100). The standard cell may have any one of the layouts of the semiconductor devices 1 through 8. Specifically, the provided standard cell may include an inverter which is composed of a plurality of PMOS transistors and a plurality of NMOS transistors and an interconnection line which is connected to an output terminal of the inverter and forms a closed loop.

Next, a semiconductor device is fabricated using the provided standard cell (operation S110). Specifically, using the provided standard cell, a deposition process, an etching process, etc. are performed on a semiconductor substrate using the provided standard cell. As a result, any one of the semiconductor devices 1 through 8 can be fabricated.

In concluding the detailed description, those skilled in the art will appreciate that many variations and modifications can be made to example embodiments without substantially departing from the principles thereof. Therefore, the disclosed example embodiments are used in a generic and descriptive sense only and not for purposes of limitation.

What is claimed is:
1. A semiconductor device comprising:
a first source electrode configured to connect a first power rail to a first impurity region, the first power rail coupled to a first voltage source;
a second source electrode configured to connect a second power rail to a second impurity region, the second power rail coupled to a second voltage source, the first and second voltage sources being different;
a gate electrode on the first and second impurity regions;
a first drain electrode on the first impurity region;
a second drain electrode on the second impurity region; and an interconnection line connected to the first drain electrode and the second drain electrode, the interconnection line forming at least one closed loop.

2. The semiconductor device of claim 1, wherein the interconnection line is higher than the first and second source electrodes, the gate electrode, and the first and second drain electrodes.

3. The semiconductor device of claim 1, wherein the gate electrode extends in a first direction, and
the interconnection line includes,
a first interconnection line part which is U-shaped, and
a second interconnection line part which extends in the first direction, the second interconnection line part is higher than the first interconnection line part.

4. The semiconductor device of claim 3, wherein the first interconnection line part further includes,
a third interconnection line part extending toward a side of the first and second drain electrodes, and
a fourth interconnection line part extending toward another side of the first and second drain electrodes, the fourth interconnection line part is higher than the third interconnection line part.

5. The semiconductor device of claim 1, wherein the first impurity region comprises an N-type impurity region, and the second impurity region comprises a P-type impurity region.

6. The semiconductor device of claim 1, wherein the first voltage source is configured to provide a power supply voltage, and the second voltage source is configured to provide a ground voltage.

7. The semiconductor device of claim 1, further comprising:
an active fin protruding from a substrate, wherein the first and second impurity regions are in the active fin.

8. The semiconductor device of claim 7, further comprising:
a gate insulating layer between the gate electrode and the active fin; and
a spacer on the active fin and on a side of the gate electrode, wherein the gate insulating layer extends along sidewalls of the spacer.

9. The semiconductor device of claim 1, further comprising:
a bridge line, and
the interconnection line includes,
a first interconnection line part forming a first closed loop, and
a second interconnection line part separated from the first interconnection line part, the second interconnection line part forming a second closed loop, the bridge line being connected to the first interconnection line part and the second interconnection line part.

10. The semiconductor device of claim 9, wherein the bridge line is higher than the first and second interconnection line parts.

11. The semiconductor device of claim 1, further comprising:
another interconnection line connected to the first drain electrode and the second drain electrode, the another interconnection line being U-shaped; and
a bridge line connected to the interconnection line which forms the at least one closed loop and the another interconnection line which is U-shaped.

12. A semiconductor device comprising:
a first transistor;
a second transistor different from the first transistor; and
an interconnection line connected to respective output terminals of the first and second transistors and a circuit element, the interconnection line forming at least one closed loop.

13. The semiconductor device of claim 12, wherein the first transistor comprises a p-type metal oxide semiconductor (PMOS) transistor, and the second transistor comprises an n-type metal oxide semiconductor (NMOS) transistor.

14. The semiconductor device of claim 12, wherein a source electrode of the first transistor is configured to receive a first voltage, and a source electrode of the second transistor is configured to receive a second voltage different than the first voltage.

15. The semiconductor device of claim 14, wherein the first voltage comprises a power supply voltage, and the second voltage comprises a ground voltage.

16. The semiconductor device of claim 12, wherein the circuit element comprises at least one of a resistor, a capacitor, an inductor, a diode, and a transistor.

17. The semiconductor device of claim 12, wherein the first transistor and the second transistor are connected in series between a first power rail and a second power rail.

18. The semiconductor device of claim 17, wherein the first transistor comprises a plurality of first transistors connected in parallel, and the second transistor comprises a plurality of second transistors connected in parallel.

19. The semiconductor device of claim 17, wherein the first power rail is configured to receive a power supply voltage, and the second power rail is configured to receive a ground voltage.

20. The semiconductor device of claim 12, wherein the semiconductor device is an inverter.

* * * * *